(12) United States Patent
Tu et al.

(10) Patent No.: US 11,114,370 B2
(45) Date of Patent: Sep. 7, 2021

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventors: Shun-Tsat Tu, Kaohsiung (TW); Hong-Jyun Lin, Kaohsiung (TW); Yi Tong Chiu, Kaohsiung (TW); Yi Chun Wu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 2 days.

(21) Appl. No.: 16/675,013

(22) Filed: Nov. 5, 2019

(65) Prior Publication Data

US 2021/0134712 A1    May 6, 2021

(51) Int. Cl.
*H01L 23/498* (2006.01)
*H01L 21/768* (2006.01)
*H01L 23/00* (2006.01)

(52) U.S. Cl.
CPC .. *H01L 23/49827* (2013.01); *H01L 21/76879* (2013.01); *H01L 21/76894* (2013.01); *H01L 23/49838* (2013.01); *H01L 23/49866* (2013.01); *H01L 24/29* (2013.01)

(58) Field of Classification Search
CPC ......... H01L 23/49827; H01L 21/76894; H01L 23/49838; H01L 23/49866; H01L 21/76879; H01L 24/29
USPC ......................................................... 257/774
See application file for complete search history.

(56) References Cited

U.S. PATENT DOCUMENTS

| 7,326,629 | B2* | 2/2008 | Nagarajan | H01L 21/76898 257/E21.597 |
| 2015/0048515 | A1* | 2/2015 | Zhang | H01L 21/76879 257/774 |

\* cited by examiner

*Primary Examiner* — Vu A Vu
(74) *Attorney, Agent, or Firm* — Foley & Lardner LLP

(57) ABSTRACT

A semiconductor device package includes a substrate, a redistribution structure, a conductive pad, a conductive element, and a conductive via. The redistribution structure is disposed over the substrate and includes a first dielectric layer and a first conductive layer. The conductive pad is disposed on a first surface of the first dielectric layer. The conductive element is disposed in the first dielectric layer and is electrically connected to the conductive pad. The conductive via extends from the conductive pad toward the substrate through the conductive element and the first dielectric layer. The first conductive layer is separated from the conductive via.

15 Claims, 48 Drawing Sheets

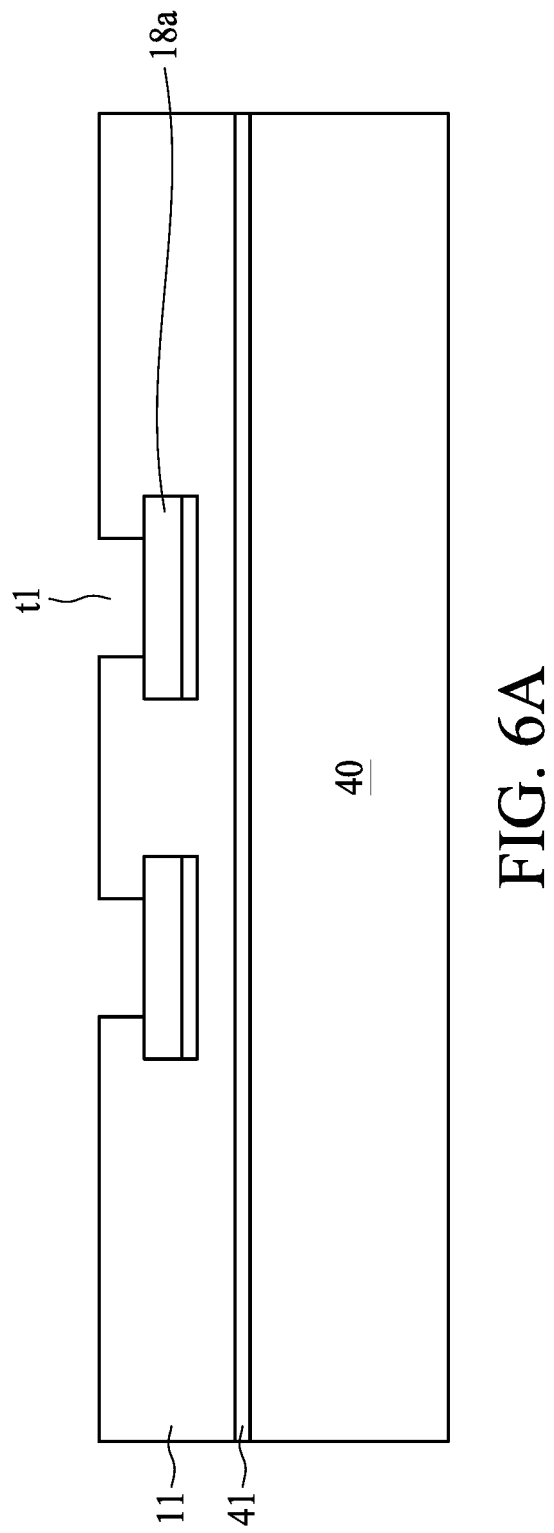

SEMICONDUCTOR DEVICE PACKAGES AND METHODS OF MANUFACTURING THE SAME

BACKGROUND

1. Field of the Disclosure

The present disclosure relates to semiconductor device packages and methods of manufacturing the same.

2. Description of Related Art

A semiconductor device package may include a substrate and a redistribution structure attached to the substrate. The redistribution structure may include dielectric layers and one or more conductive layers in the dielectric layers. To electrically connect the substrate and the redistribution structure, a laser drilling process followed by an electroplating process may be performed. The laser drilling penetrates the dielectric layers and the conductive layers of the redistribution structure.

SUMMARY

According to some example embodiments of the present disclosure, a semiconductor device package comprises a substrate, a redistribution structure, a conductive pad, a conductive element, and a conductive via. The redistribution structure is disposed over the substrate and includes a first dielectric layer and a first conductive layer. The conductive pad is disposed on a first surface of the first dielectric layer. The conductive element is disposed in the first dielectric layer and is electrically connected to the conductive pad. The conductive via extends from the conductive pad toward the substrate through the conductive element and the first dielectric layer. The first conductive layer is separated from the conductive via.

According to some example embodiments of the present disclosure, a semiconductor device package comprises a substrate, a first dielectric layer, a conductive element, a first conductive layer, a conductive via and a second dielectric layer. The first dielectric layer has a top surface, a bottom surface, and a lateral surface. The conductive element is disposed in the first dielectric layer. The first conductive layer is disposed on the bottom surface and the lateral surface of the first dielectric layer and electrically connected with the conductive element. The conductive via is disposed on the substrate. The second dielectric layer is disposed between the first conductive layer and the conductive via. The second dielectric layer encloses the conductive via.

According to some example embodiments of the present disclosure, a method of manufacturing a semiconductor device package includes providing a carrier; forming a dielectric layer on the carrier; forming a conductive element in a dielectric layer; forming a conductive layer on the dielectric layer and a portion of the conductive element; and forming a conductive via through the conductive element and the dielectric layer; wherein the conductive layer and the conductive via directly contact the conductive element.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 6A, FIG. 6B, FIG. 6C, and FIG. 6D illustrate various stages of a method for manufacturing a semiconductor device package of FIG. 3A.

DETAILED DESCRIPTION

Figure 1A:
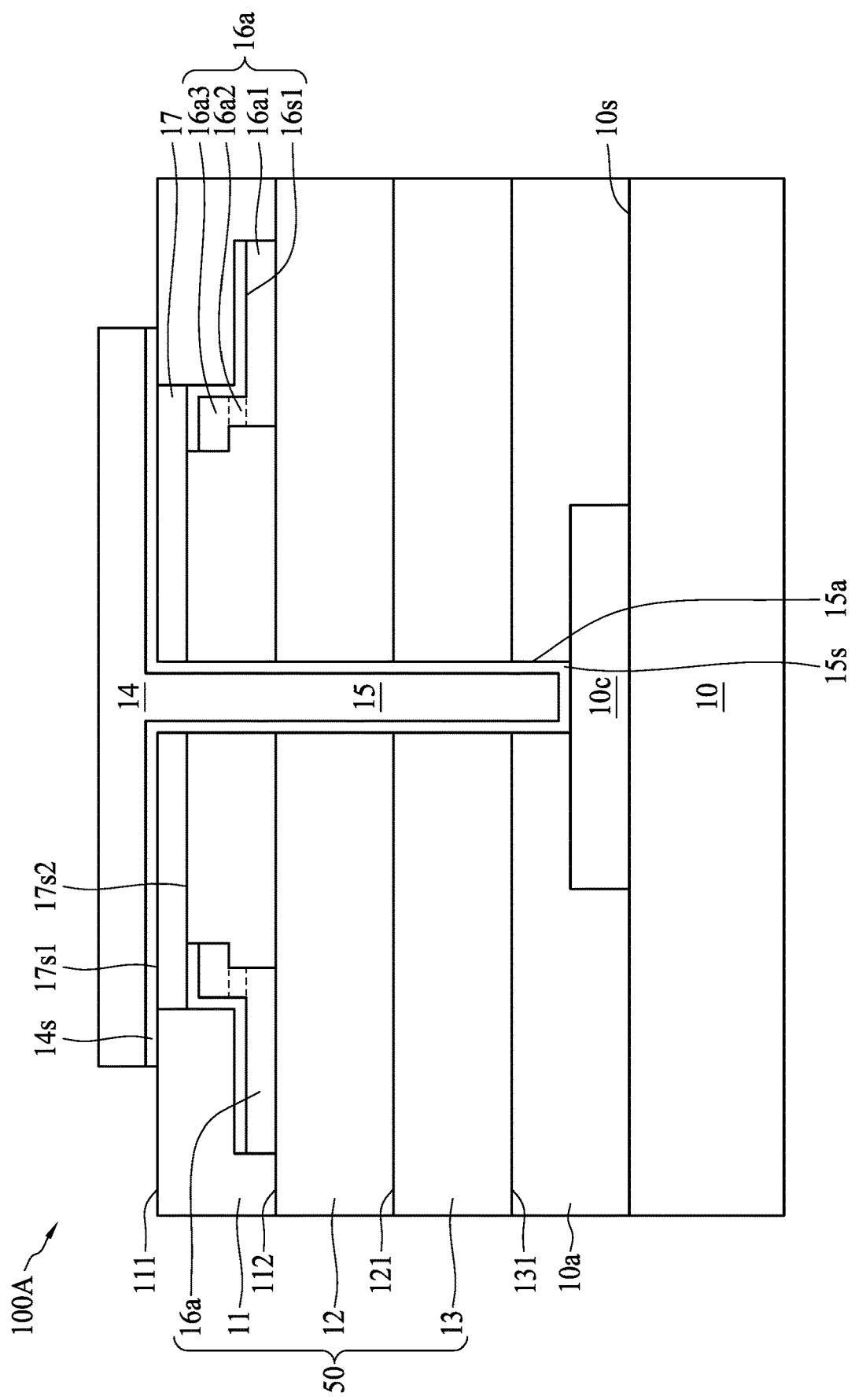
FIG. 1A is a cross-sectional view of a semiconductor device package in accordance with an embodiment.

In semiconductor packaging, a redistribution structure which includes dielectric layers and conductive layers in the dielectric layers may be attached to a substrate. To electrically connect the substrate and the redistribution structure, a laser drilling process, for example, a $CO_2$ laser drilling, followed by an electroplating process may be performed. In particular, the conductive layers may be designed with via pads for the purpose of the electrical connection. Then, the $CO_2$ laser drilling penetrates the dielectric layers and the via pads of the conductive layers of the redistribution structure. Since the $CO_2$ laser drilling has a higher etch rate to dielectric material than to conductive material, more dielectric material is removed than conductive material. Consequently, dielectric layers at the walls of a drilled-through via tend to recess inward as compared to the via pads. The non-uniform or discontinuous profiles at the walls of a drilled-through via cause a problem during a subsequent electroplating process, for example, a poor adhesion between the electroplated material and the dielectric layers or the via pads, resulting in a crack or delamination therebetween.

A semiconductor device package in accordance with the embodiments of the present disclosure includes a substrate and a redistribution structure attached to the substrate. The redistribution structure includes dielectric layers and conductive layers in the dielectric layers. The conductive layers facilitate signal fan-out from a first conductive pad on the substrate towards a second conductive pad on the redistribution structure. The semiconductor device package also includes a conductive element and a conductive via. The conductive element, disposed in the redistribution structure, is electrically connected between the second conductive pad and each of the conductive layers. The conductive via is electrically connected between the first conductive pad and the second conductive pad, and is electrically connected with the conductive element. The conductive via, electrically connected with the conductive layers through the conductive element, however, is separated from the conductive layers. Specifically, the conductive via extends through the dielectric layers without physically contacting the conductive layers. With such design, during manufacturing of the semiconductor device package, in particular in forming the conductive via by using a drilling process, while drilling through the redistribution structure, the dielectric layers are selectively penetrated and the conductive layers in the dielectric layers are kept intact. In contrast, in some other approaches, dielectric layers and conductive layers in a redistribution structure are both penetrated, resulting in non-uniform profiles or even discontinuous connection between conductive layers at the walls of a drilled-through via. The semiconductor device package in accordance with the present disclosure solves this problem.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A is a cross-sectional view of a semiconductor device package 100A in accordance with an embodiment.

Referring to FIG. 1A, the semiconductor device package 100A includes a substrate 10, a redistribution structure 50, a conductive pad 14, a conductive via 15, and a conductive element 17.

The substrate 10 includes a conductive pad 10c on a surface 10s thereof. An adhesive layer 10a is disposed between the substrate 10 and the redistribution structure 50. The conductive pad 10c is embedded in the adhesive layer 10a.

The redistribution structure 50 includes a first dielectric layer 11, a second dielectric layer 12 and a third dielectric layer 13. The first dielectric layer 11 is disposed on the second dielectric layer 12, the second dielectric layer 12 is disposed on the third dielectric layer 13, and the third dielectric layer 13 is disposed on the adhesive layer 10a over the substrate 10. Specifically, the first dielectric layer 11 has a first surface 111 and a second surface 112 opposite to the first surface 111. The second dielectric layer 12 is disposed on the second surface 112. The second dielectric layer 12 has a surface 121 facing towards the conductive pad 10c. The third dielectric layer 13 is disposed on the surface 121 of the second dielectric layer 12. The third dielectric layer 13 has a surface 131 facing towards the conductive pad 10c. The adhesive layer 10a is disposed on the surface 131 of the third dielectric layer 13.

In an embodiment, the first dielectric layer 11 may include borophosphosilicate glass (BPSG), silicon oxide, silicon nitride, silicon oxynitride, undoped silicate glass (USG), any combination thereof, or the like. Suitable materials for the second dielectric layer 12 and the third dielectric layer 13 may be similar to or identical with those of the first dielectric layer 11 and thus are not further discussed.

The redistribution structure 50 further includes a conductive layer 16a disposed in the dielectric layer 11. The first conductive layer 16a directly contacts the conductive element 17, which in turn directly contacts the conductive via 15. However, the first conductive layer 16a is separated from the conductive via 15. Suitable materials for the first conductive layer 16a may include, but are not limited to, nickel, copper, gold, titanium, tungsten or platinum.

The first conductive layer 16a includes a first, a second, and a third portion 16a1, 16a2, and 16a3. The first portion 16a1, substantially disposed on the second surface 112, extends in a direction different from the conductive via 15 that extends in a first direction. The third portion 16a3, disposed at a higher elevation than the first portion 16a1 with respect to the substrate 10, also extends in a direction different from the first direction. The second portion 16a2 extends in a direction substantially parallel to the first direction. The second portion 16a2 connects the first portion 16a1 and the third portion 16a3. The first conductive layer 16a further includes a seed layer 16s1 substantially conformal with first portion 16a1, second portion 16a2 and third portion 16a3. A portion of the seed layer 16s1 disposed on the third portion 16a3 directly contacts a first surface 17s2 of the conductive element 17 and electrically connects the first conductive layer 16a to the conductive element 17.

The conductive pad 14 is disposed on the first surface 111 of the first dielectric layer 11. The conductive pad 14 is electrically connected to and disposed on the conductive via 15. Also, the conductive pad 14 is electrically connected to and disposed on a second surface 17s1 (e.g. a top surface) of the conductive element 17. Moreover, the conductive pad 14 may cover the conductive element 17. The conductive pad 14 includes a seed layer 14s on the first surface 111 of the first dielectric layer 11 and the second surface 17s1 of the conductive element 17. The material of conductive pad 14 may include but is not limited to nickel, copper, gold, titanium, tungsten or platinum. In some embodiments, the conductive pad 14 may exclude the seed layer 14s, given that the conductive pad 14 is formed by an electroless plating.

The conductive via 15 is electrically connected with the conductive element 17, which is disposed in the first dielectric layer 11 of the redistribution structure 50. The conductive via 15 extends from the conductive pad 14 to the conductive pad 10c of the substrate 10 through the conductive element 17 and the redistribution structure 50. In particular, the conductive via 15 extends through the first, second, and third dielectric layers 11, 12, and 13. A top portion of the conductive via 15 is enclosed by the conductive element 17 and the remaining portion of the conductive via 15 is enclosed by the redistribution structure 50.

In an embodiment, an opening through the redistribution structure is formed by $CO_2$ laser drilling, which may then be filled with a conductive material to form the conductive via 15. The diameter of the opening is determined by a hollow structure defined by the conductive element 17. In the $CO_2$ laser drilling, the opening is formed by penetrating or drilling through a single material (e.g., a dielectric material) in the redistribution structure 50. Drilling through a single material (e.g., a dielectric material) in the redistribution structure 50 provides the opening with a continuous profile, which subsequently provides a continuous profile along a lateral surface 15a of the conductive via 15. For example, the continuous profile may include a substantially linear profile (e.g., smooth profile). Advantageously, the continuous profile of the lateral surface 15a prevents a void between the conductive via 15 and the redistribution structure 50. Therefore, a seed layer 15s of the conductive via 15 subsequently formed by, for example, a sputtering process, can have a smooth contour of the lateral surface 15a and can have relatively strong adhesion with the single material (the dielectric material) in the redistribution structure 50. Advantageously, the well-formed seed layer prevents electromigration between the conductive via 15 and the redistribution structure 50. In some embodiments, the conductive via 15 may exclude the seed layer 15s, given that the conductive via 15 is formed by an electroless plating.

In terms of electrical connections, the conductive element 17 functions to electrically connect the first conductive layer 16a to the conductive via 15, given that the first conductive layer 16a is separated from the conductive via 15. The conductive via 15 functions to electrically connect the redistribution layer 50 to the substrate 10. Specifically, the first conductive layer 16a of the redistribution layer 50 is electrically connected to the conductive pad 10c of the substrate 10 via the conductive element 17 and the conductive via 15.

In some embodiments, the conductive element 17 may have a ring or ring-like structure. In some embodiments, the conductive element 17 may have a horseshoe-like structure. In some embodiments, the conductive element 17 may have a hollow structure.

The material of conductive via 15 may include, but is not limited to, nickel, copper, gold, titanium, tungsten or platinum. As well, the conductive element 17 may include a single layer or multi-layer structure. The material of conductive element 17 may include, but is not limited to, nickel, copper, gold, titanium, tungsten or platinum.

Figure 1B:
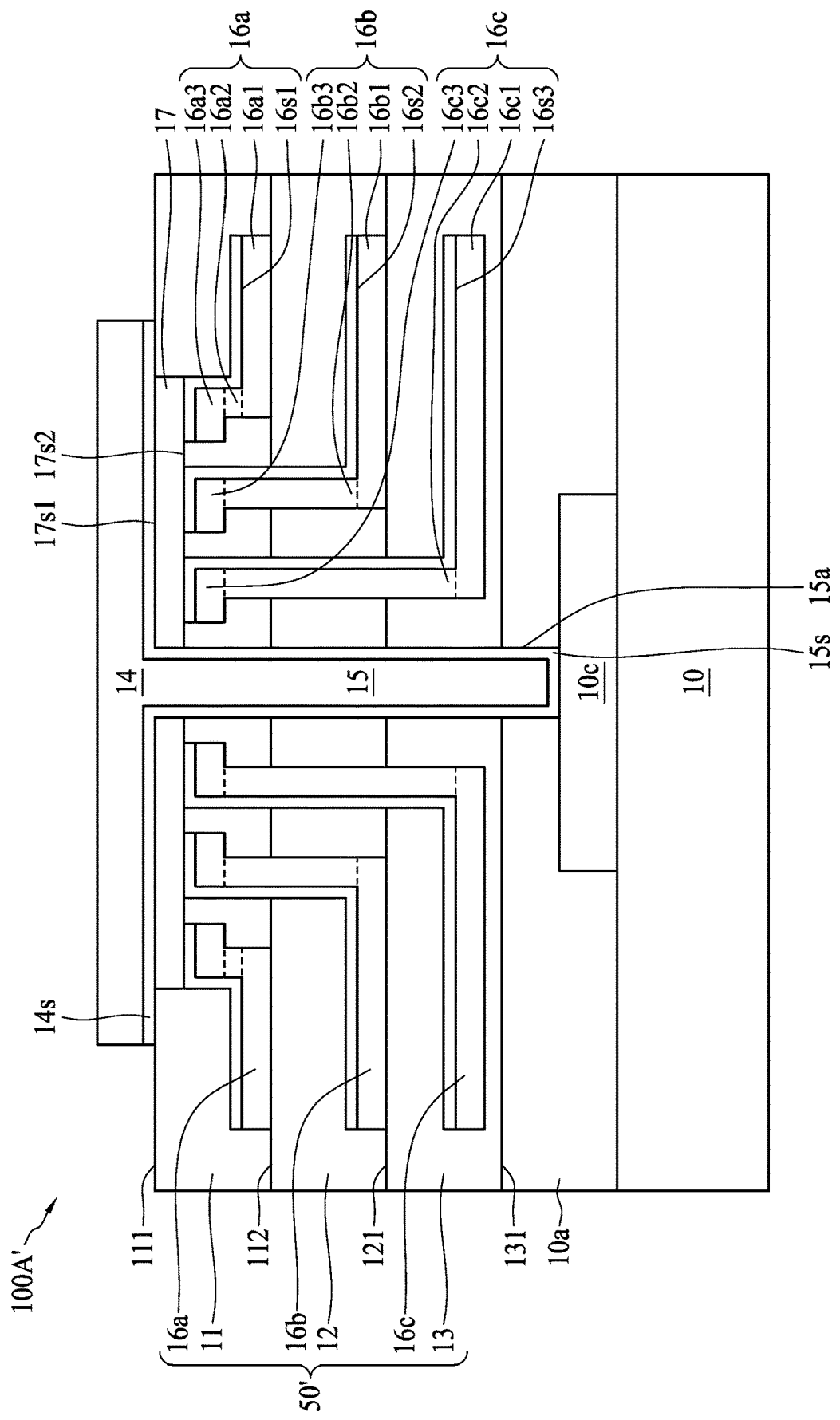
FIG. 1B is a cross-sectional view of a semiconductor device package in accordance with another embodiment.

FIG. 1B is a cross-sectional view of a semiconductor device package 100A' in accordance with another embodiment. Referring to FIG. 1B, the semiconductor device package 100A' is similar to the semiconductor device package 100A in FIG. 1A except that, for example, a redistribution structure 50' further includes a second conductive layer 16b and a third conductive layer 16c.

The second conductive layer 16b is disposed in the first and second dielectric layers 11, 12. The second conductive layer 16b directly contacts the conductive element 17, which in turn directly contacts the conductive via 15. However, the second conductive layer 16b is separated from the conductive via 15. Moreover, the second conductive layer 16b is separated from the first conductive layer 16a. The second conductive layer 16b is disposed between the conductive via 15 and the first conductive layer 16a, and thus is positioned closer to the conductive via 15 than the first conductive layer 16a. Suitable materials for the second conductive layer 16b may include, but are not limited to, nickel, copper, gold, titanium, tungsten or platinum.

The second conductive layer 16b includes first, second, and third portions 16b, 16b2, and 16b3. The first portion 16b1, substantially disposed on the surface 121 of the second dielectric layer 12, extends in a direction different from the conductive via 15 that extends in the first direction. The third portion 16b3, disposed at a higher elevation than the first portion 16b1 with respect to the substrate 10, also extends in a direction different from the first direction. The second portion 16b2 extends in a direction substantially parallel to the first direction. The second portion 16b2 connects the first portion 16b1 and the third portion 16b3. The second conductive layer 16b further includes a seed layer 16s2 substantially conformal with first portion 16b1, second portion 16b2 and third portion 16b3. A portion of the seed layer 16s2 that is disposed on the third portion 16b3 directly contacts a first surface 17s2 of the conductive element 17 and electrically connects the second conductive layer 16b to the conductive element 17. The portion 16b2 has a length longer than that of the second portion 16a2 in the second direction.

The third conductive layer 16c is disposed in the first, second, and third dielectric layers 11, 12, and 13. The third conductive layer 16c directly contacts the conductive element 17, which in turn directly contacts the conductive via 15. However, the third conductive layer 16c is separated from the conductive via 15. Moreover, the third conductive layer 16c is separated from the first conductive layer 16a and the second conductive layer 16b. The third conductive layer 16c is disposed between the conductive via 15 and the second conductive layer 16b, and thus is positioned closer to the conductive via 15 than the first and second conductive layers 16a and 16b. Suitable materials for the third conductive layer 16c may include, but are not limited to, nickel, copper, gold, titanium, tungsten or platinum.

The third conductive layer 16c includes first, second, and third portions 16c1, 16c2, and 16c3. The first portion 16c1, substantially disposed above the surface 131 of the second dielectric layer, extends in a direction different from the conductive via 15 that extends in the first direction. The third portion 16c3, disposed at a higher elevation than the first portion 16c1 with respect to the substrate 10, also extends in a direction different from the first direction. The second portion 16c2 extends in a direction substantially parallel to the first direction. The second portion 16c2 connects the first portion 16c1 and the third portion 16c3. The third conductive layer 16c further includes a seed layer 16s3 substantially conformal with first portion 16c1, second portion 16c2 and third portion 16c3. A portion of the seed layer 16s3 that is disposed on the third portion 16c3 directly contacts the first surface 17s2 of the conductive element 17 and electrically connects the third conductive layer 16c to the conductive element 17. The portion 16c2 has a length longer than that of the second portion 16b2 in the second direction.

In terms of electrical connections, the conductive element 17 functions to electrically connect the second conductive layer 16b to the conductive via 15, given that the second conductive layer 16b is separated from the conductive via 15. The conductive element 17 functions to electrically connect the third conductive layer 16c to the conductive via 15, given that the third conductive layer 16c is separated from the conductive via 15.

Figure 1C:
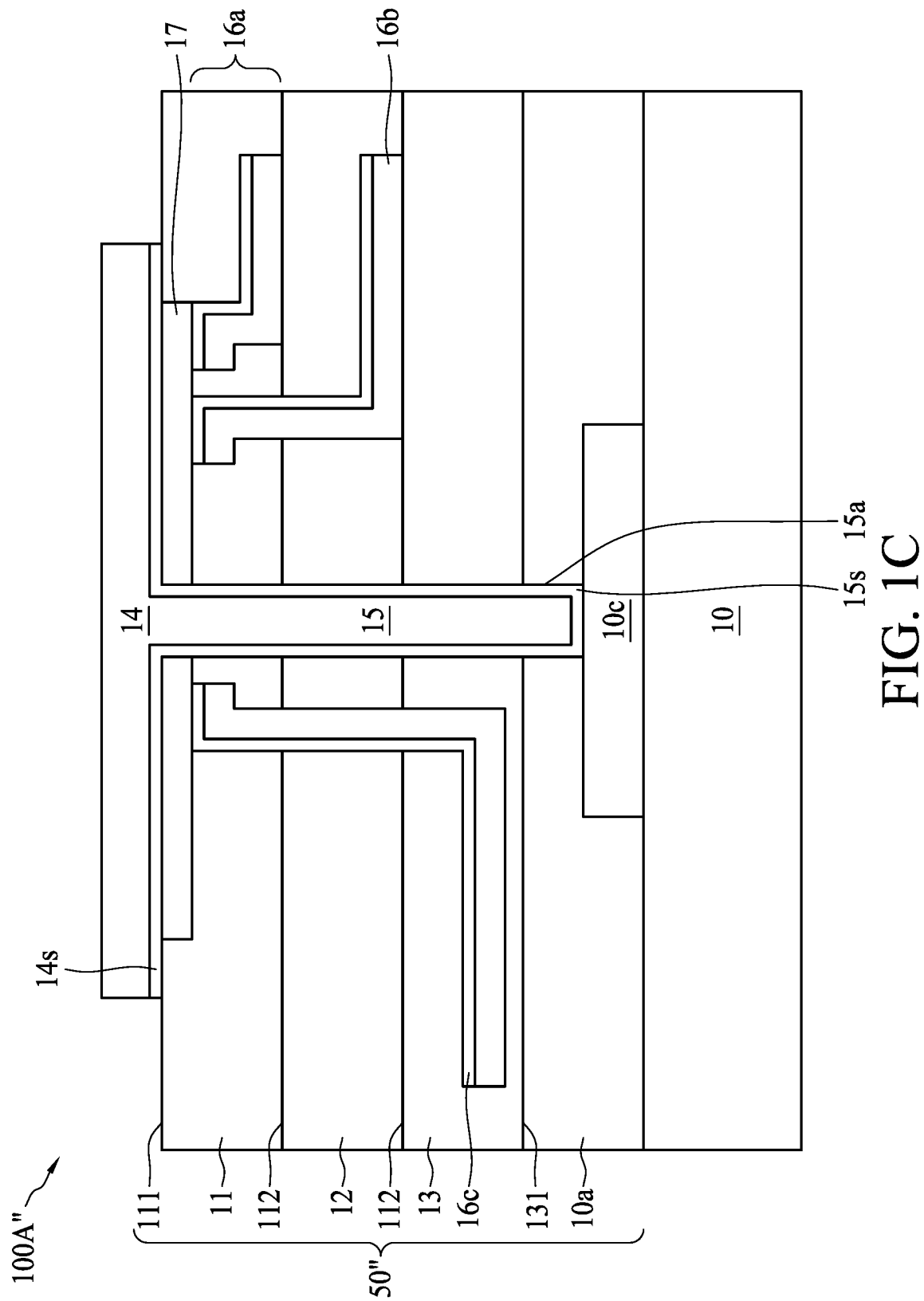
FIG. 1C is a cross-sectional view of a semiconductor device package in accordance with still another embodiment.

FIG. 1C is a cross-sectional view of a semiconductor device package 100A" in accordance with still another embodiment. Referring to FIG. 1C, the semiconductor device package 100A" is similar to the semiconductor device package 100A' in FIG. 1BA except that, for example, each of the conductive layers 16a, 16 b and 16c does not surround the conductive via 15. Specifically, the first conductive layer 16a and the second conductive layer 16 b are located at one side (in the present embodiment the left side) of the conductive via 15, and that the third conductive layer 16c is located at the other side (the right side) of the conductive via 15. It is appreciated that the first, second, and third conductive layers 16a, 16 b and 16c may have different arrangements depending on the circuitry in the redistribution structure 50".

Figure 1D:
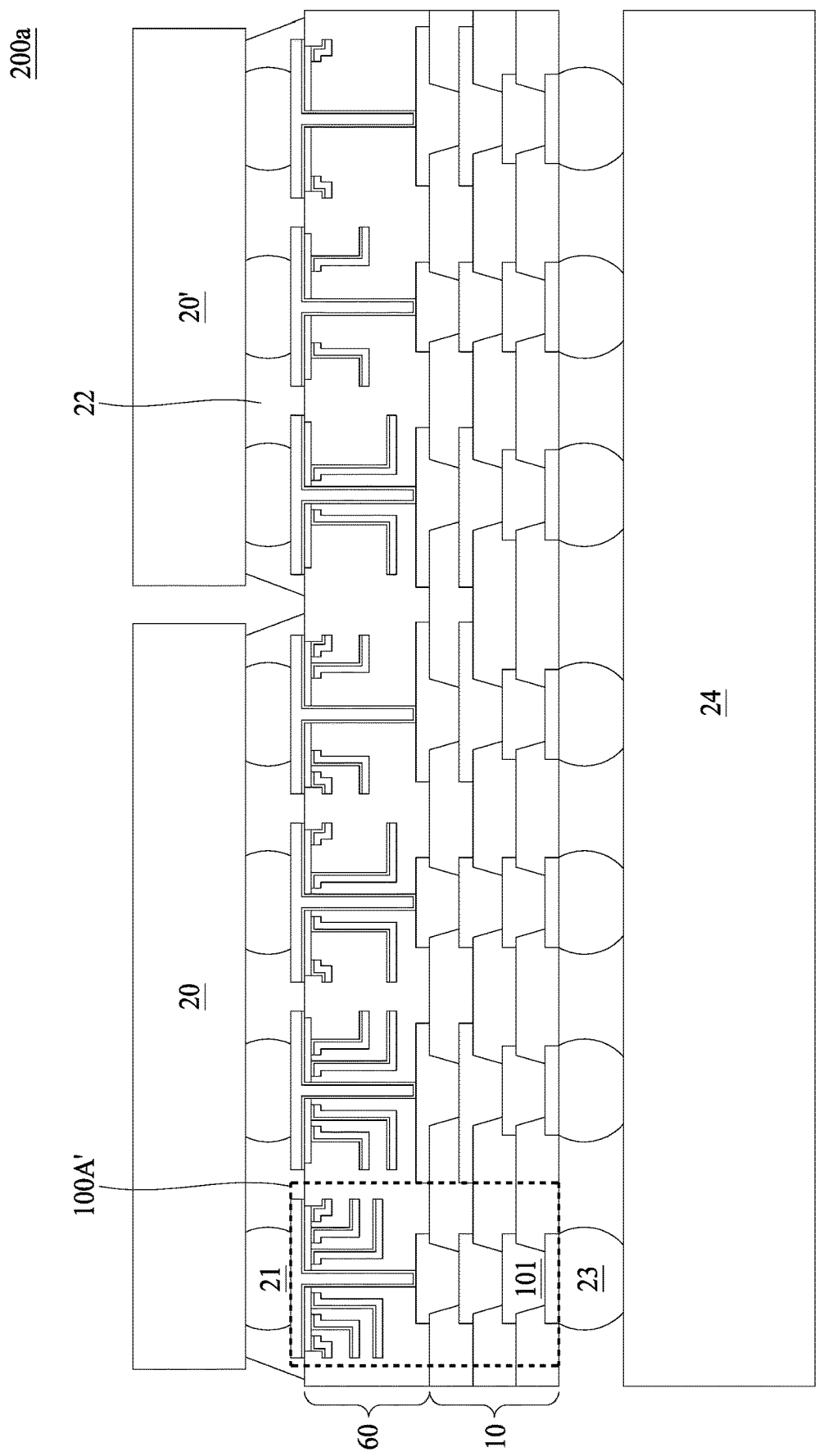
FIG. 1D is a cross-sectional view of a semiconductor device package in accordance with yet another embodiment.

FIG. 1D is a cross-sectional view of a semiconductor package assembly 200a in accordance with an embodiment.

As shown in FIG. 1D, the semiconductor package assembly 200a includes a plurality of semiconductor device packages, a substrate 10, a redistribution structure 60, semiconductor devices 20 and 20', connection elements 21 and 23, an insulation body 23, and a carrier 24. The semiconductor devices 20 and 20' are attached to the redistribution structure 60 via connection elements 21. As shown in FIG. 1D, the semiconductor package assembly 200a includes different semiconductor device packages. Some semiconductor device packages have multiple conductive layers as the semiconductor device package 100A' illustrated in FIG. 1B, while the others have a single conductive layer as the semiconductor device package 100A illustrated in FIG. 1A. In the present embodiment, the semiconductor device 20 is attached via the connection elements 21 to semiconductor device packages with multiple conductive layers in the redistribution structure 60. The multiple conductive layers may include at least two of the first, second and third conductive layers 16a, 16b and 16c. Furthermore, the semiconductor device 20' is attached via the connection elements 21 to semiconductor device packages with a single conductive layer in the redistribution structure 60. The single conductive layer may include only one of the first, second or third conductive layers 16a, 16b and 16c. In other embodiments, the redistribution structure 60 of the semiconductor package assembly 200a may include more than three conductive layers.

The substrate 10 includes a plurality of interconnection structures 101 connecting the semiconductor device package 100A' and the connection element 23, which in turn connects with the carrier 24, for example, a printed circuit board (PCB). The connection elements 21 and 23 may each include, for example, but is not limited to, solder, adhesive, or other suitable bonding material(s). The insulation body 22 is disposed between the semiconductor device package 100A' and the semiconductor device 20. In some embodiments, suitable materials of the insulation body 22 may include molding compound such as epoxy molding compound (EMC).

Figure 2A:
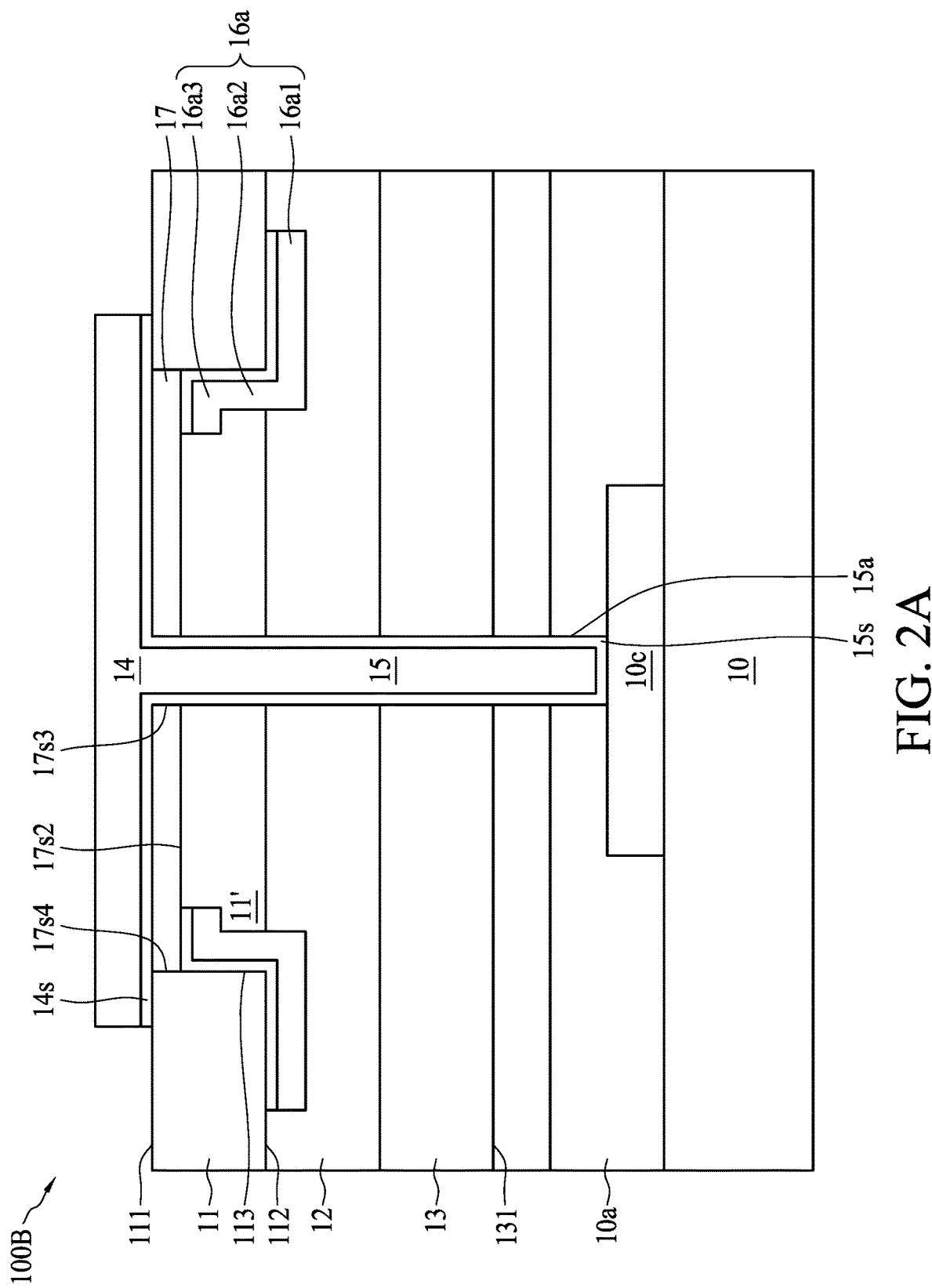
FIG. 2A is a cross-sectional view of a semiconductor device package in accordance with an embodiment.

FIG. 2A is a cross-sectional view of a semiconductor device package 100B in accordance with some embodiments of the present disclosure. Referring to FIG. 2A, the semiconductor device package 100B includes a substrate 10, dielectric layers 11, 11', 12, and 13, a conductive pad 14, a conductive via 15, a conductive layer 16a and a conductive element 17. For the materials of the components in the semiconductor device package 100B (such as the substrate, the dielectric layers, the conductive via, and the conductive layers), please refer to the corresponding components described and illustrated with respect to FIG. 1A.

The dielectric layer 11 has a top surface 111, a bottom surface 112 and a lateral surface 113. The conductive element 17 is disposed beneath the top surface 111. The first conductive layer 16a is disposed on the bottom surface 112 and the lateral surface 113. The first conductive layer 16a is disposed on the first surface 17s2 of the conductive element 17. The first conductive layer 16a includes portions 16a1, 16a2 and 16a3. The portion 16a1 is disposed on the bottom surface 112. The portion 16a2 is disposed on the lateral surface 113. The portion 16a3 is disposed on the conductive element 17.

The dielectric layer 11' is disposed between the conductive via 15 and the conductive layer 16a and is disposed on the conductive element 17. In an embodiment, the dielectric layer 11' may surround the portion of the conductive via 15 between the conductive element 17 and the dielectric layer 12.

The conductive pad 14 extends along the top surface 111. The conductive pad 14 is electrically connected to the conductive via 15 and the conductive element 17. The conductive via 15 extends through the dielectric layers 11', 12 and 13. The conductive via 15 is surrounded by the dielectric layers 11', 12 and 13. A top portion of the conductive via 15 is enclosed by the conductive element 17.

The conductive element 17 has an inner lateral surface 17s3 directly contacting the conductive via 15. The conductive element 17 has an outer lateral surface 17s4 directly contacting the first dielectric layer 11. The conductive layer 16a is electrically connected to the conductive via 15 and the conductive element 17 via the conductive element 17.

Figure 2B:
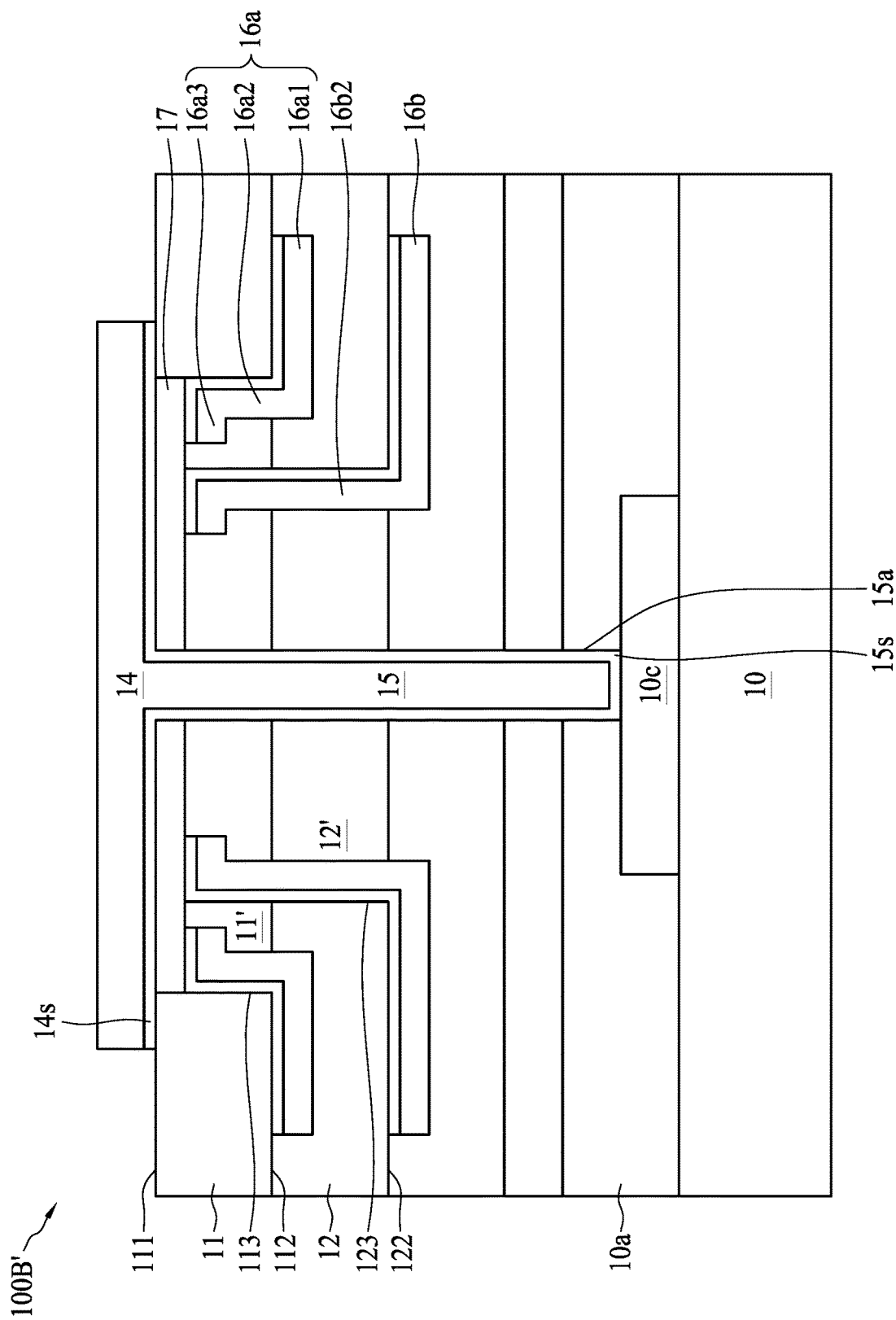
FIG. 2B is a cross-sectional view of a semiconductor device package in accordance with another embodiment.

FIG. 2B is a cross-sectional view of a semiconductor device package 100' in accordance with some embodiments of the present disclosure. Referring to FIG. 2B, the semiconductor device package 100B' is similar to the semiconductor device package 100B in FIG. 2A except that, for example, a second conductive layer 16b is disposed on a bottom surface 122 and a lateral surface 123 of the dielectric layer 12. The second conductive layer 16b extends through the dielectric layer 11'. The second conductive layer 16b is electrically connected with the conductive element 17. The dielectric layer 12' is disposed between the conductive via 15 and the second conductive layer 16b. The dielectric layer 12' is disposed on the dielectric layer 11'. The conductive via 15 extends through the dielectric layer 11', 12' and 13. The conductive via 15 is enclosed by the dielectric layer 11', 12' or 13.

Figure 2C:
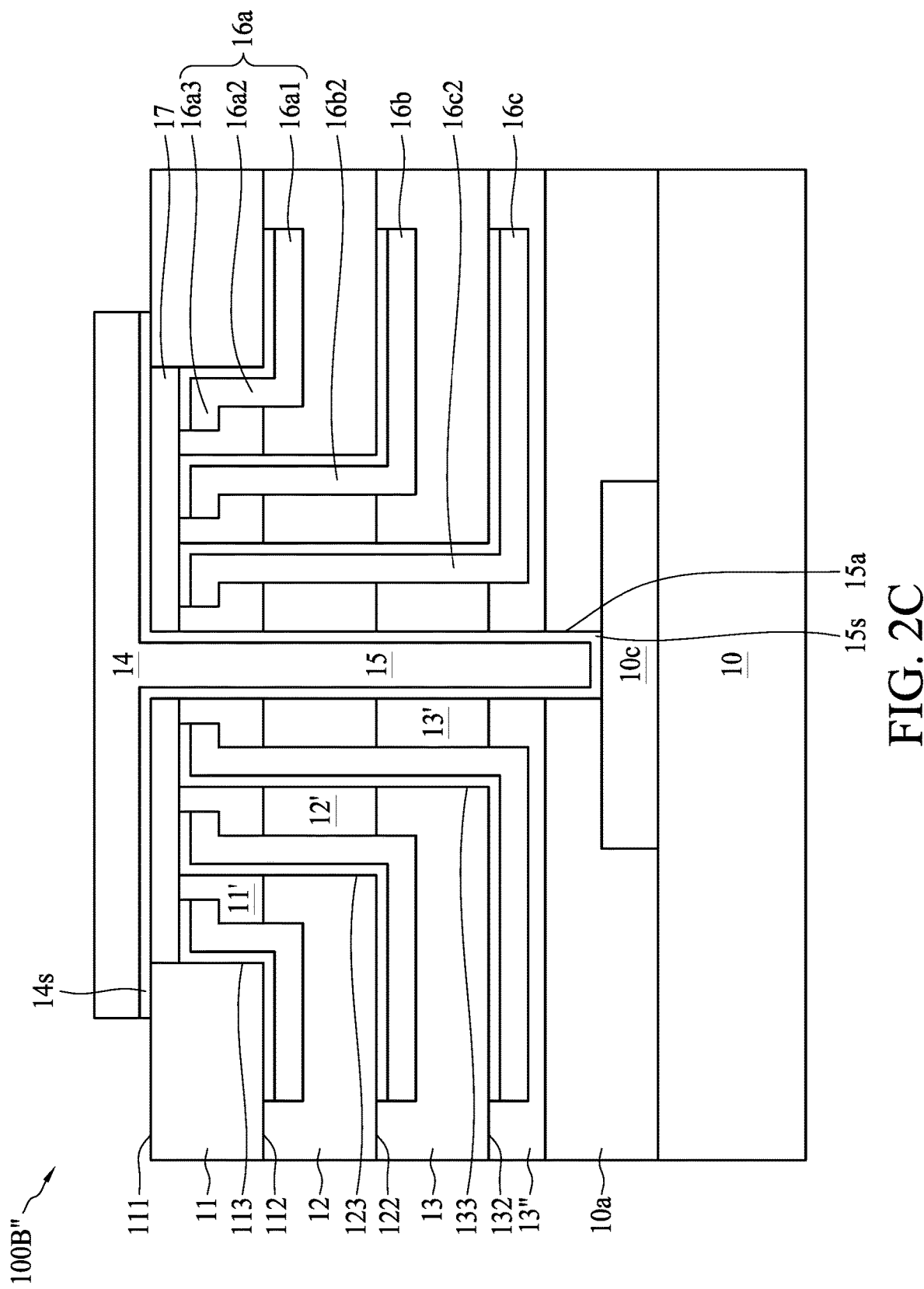
FIG. 2C is a cross-sectional view of a semiconductor device package in accordance with still another embodiment.

FIG. 2C is a cross-sectional view of a semiconductor device package 100" in accordance with some embodiments of the present disclosure. Referring to FIG. 2C, the semiconductor device package 100B" is similar to the semiconductor device package 100B in FIG. 2A except that, for example, a conductive layer 16c disposed on a bottom surface 132 and a lateral surface 133 of the dielectric layer 13. The conductive layer 16c extend through the dielectric layer 11' and 12'. The conductive layer 16c is electrically connected with the conductive element 17.

The dielectric layer 12' is disposed between the conductive via 15 and the conductive layer 16c. The dielectric layer 13' is disposed on the dielectric layer 12'. The conductive via 15 extends through the dielectric layer 11', 12' and 13'. The conductive via 15 is enclosed by the dielectric layer 11', 12' or 13'.

Figure 3A:
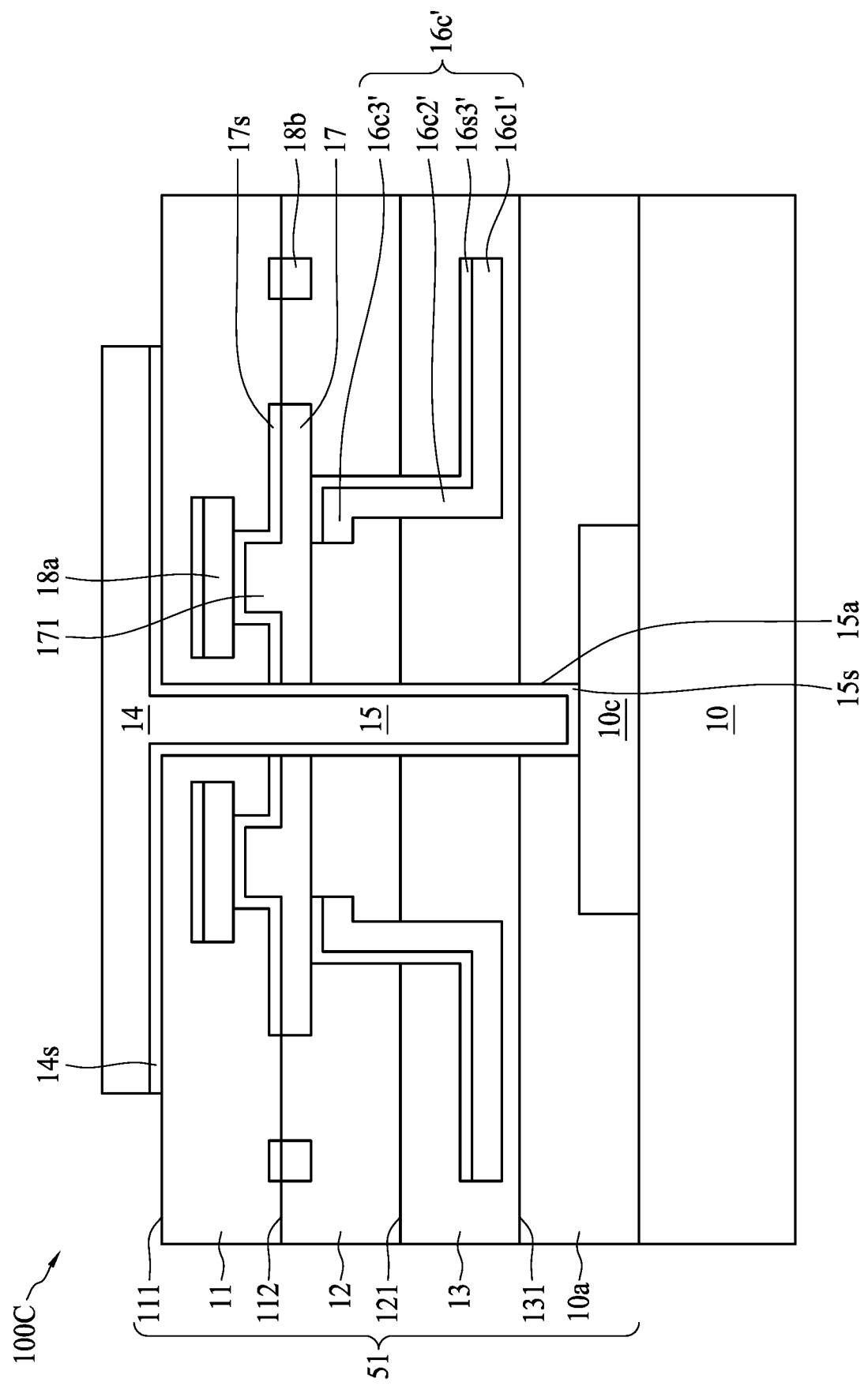
FIG. 3A is a cross-sectional view of a semiconductor device package in accordance with an embodiment.

FIG. 3A is a cross-sectional view of a semiconductor device package 100C in accordance with still another embodiment. Referring to FIG. 3A, the semiconductor device package 100C includes a substrate 10, a conductive pad 14, a conductive via 15, a conductive element 17, and a redistribution structure 51 which includes first, second, and third dielectric layers 11, 12, 13, and conductive layers 16c', 18a and 18b. For the materials of the components in the semiconductor device package 100C (such as the substrate, the dielectric layers, the conductive via, and the conductive layers), please refer to the corresponding components described with respect to FIG. 1A.

The first dielectric layer 11 has a surface 111 and a surface 112 opposite to the surface 111. The second dielectric layer 12 having a surface 121 is disposed on the surface 112. The third dielectric layer 13 having a surface 131 is disposed on the surface 121 of the second dielectric layer 12. An adhesive layer 10a is disposed on the surface 131 of the third dielectric layer 13. The substrate 10 is attached to the third dielectric layer 13 via the adhesive layer 10a.

The conductive layer 18a is disposed in the first dielectric layer 11 and is separated from the conductive via 15. The conductive layer 18b is disposed in the second dielectric layer 12 and is separated from the conductive via 15.

The conductive pad 14 is disposed on the surface 111 of the first dielectric layer 11. The conductive pad 14 is electrically connected to and disposed on the conductive via 15. The conductive pad 14 includes a seed layer 14s on the first surface 111 of the first dielectric layer.

The conductive via 15 is electrically connected with the conductive element 17, which is disposed in the first and second dielectric layers 11, 12 of the redistribution structure 50. The conductive via 15 extends from the conductive pad 14 to the conductive pad 10c of the substrate 10 through the conductive element 17 and the redistribution structure 50. In particular, the conductive via 15 extends through the first, second, and third dielectric layers 11, 12, and 13. A top portion of the conductive via 15 is enclosed by the conductive element 17 and the remaining portion of the conductive via 15 is enclosed by the redistribution structure 50. In contrast to the semiconductor device package 100A in FIG. 1A, the conductive pad 14 in FIG. 3A, the conductive element 17 is separated from the conductive pad 14. The conductive element 17 is electrically connected to the conductive via 15. The conductive element 17 extends along the surface 112. The conductive element 17 includes a seed layer 17s substantially conformal with the conductive element 17 and a protrusion 171 of the conductive element 17. The protrusion 171 abuts and is electrically connected to the conductive layer 18a The conductive element 17 provide an electrical connection for the conductive layer 18a to the conductive via 15, given that the conductive layer 18a is separated from the conductive via 15.

The conductive layer 16c' is disposed in the dielectric layers 12 and 13. The conductive layer 16c' is separated from the conductive via 15, but is electrically connected with the conductive element 17. The conductive layer 16c' includes portions 16c1', 16c2', and 16c3'. The portion 16c1' first portion 16c1', substantially disposed above the surface 131 of the second dielectric layer, extends in a direction different from the conductive via 15 that extends in the first direction. The third portion 16c3', disposed at a higher elevation than the first portion 16c1' with respect to the substrate 10, also extends in a direction different from the first direction. The second portion 16c2' extends in a direction substantially parallel to the first direction. The second portion 16c2' connects the first portion 16c1' and the third portion 16c3'.

The conductive layer 16c is electrically connected to the conductive via 15 via the conductive element 17. The conductive element 17 functions to electrically connect the conductive layer 18a and the conductive layer 16c to the conductive via 15 when the conductive layer 18a and the conductive layer 16c are separated from the conductive via 15.

In an embodiment, an opening through the distribution structure is formed by $CO_2$ laser drilling, which may then be filled with a conductive material to form the conductive via 15. The diameter of the opening is determined by a hollow structure defined by the conductive element 17. In the $CO_2$ laser drilling, the opening is formed by penetrating or drilling through a single material (e.g., a dielectric material) in the redistribution structure 51. Drilling through a single material (e.g., a dielectric material) in the redistribution structure 51 provides the opening with a continuous profile, which subsequently provides a continuous profile along a lateral surface 15a of the conductive via 15. For example, the continuous profile may include a substantially linear profile (e.g., smooth profile). Advantageously, the continuous profile of the lateral surface 15a prevents a void between the conductive via 15 and the redistribution structure 51. Therefore, a seed layer 15s subsequently formed by, for example, a sputtering process, can have a smooth contour of the lateral surface 15a and can have relatively strong adhesion with the single material (the dielectric material) in the redistribution structure 51. Advantageously, the well-formed seed layer prevents electromigration between the conductive via 15 and the redistribution structure 51.

Figure 3B:
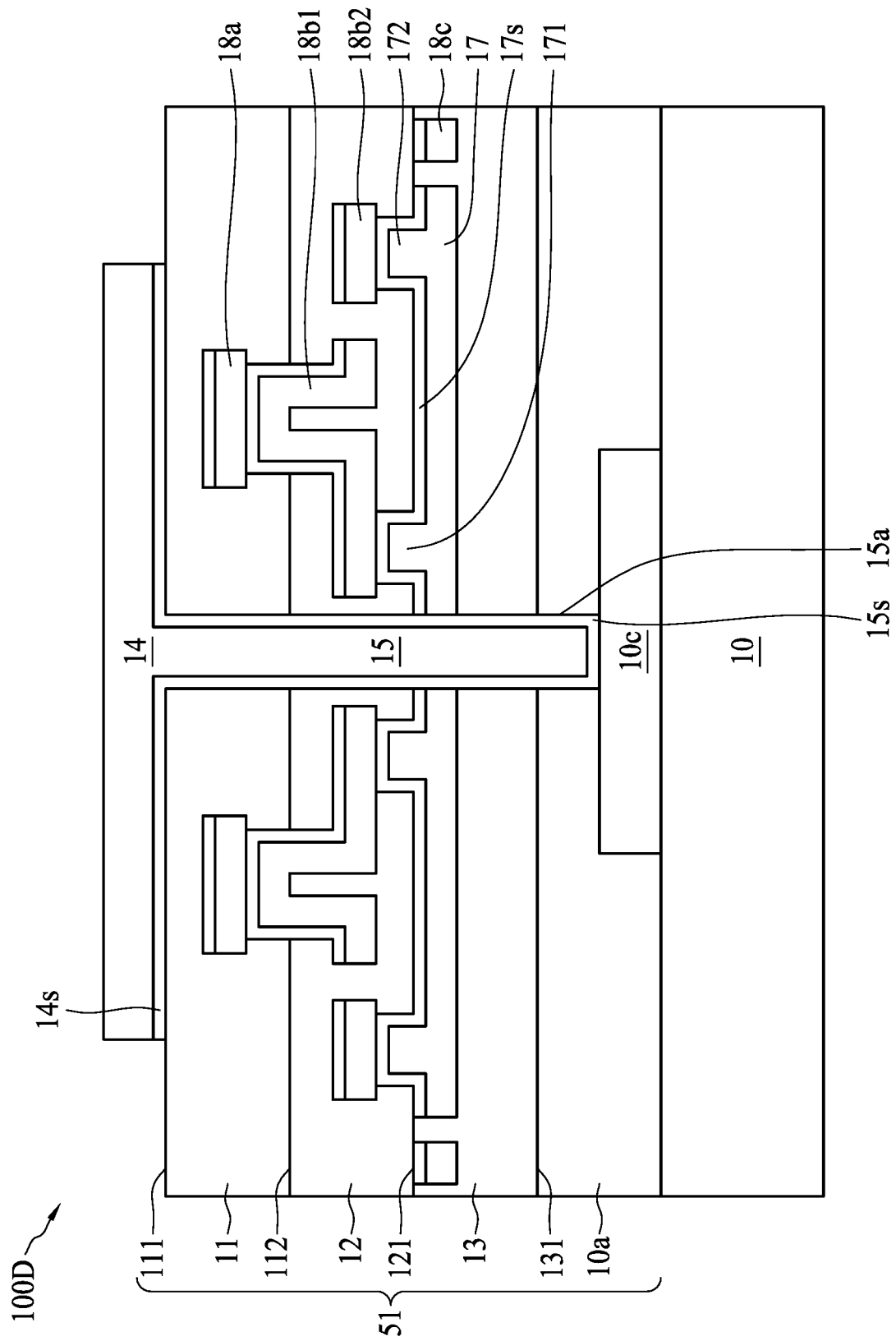
FIG. 3B is a cross-sectional view of a semiconductor device package in accordance with another embodiment.

FIG. 3B is a cross-sectional view of a semiconductor device package 100D in accordance with another embodiment. Referring to FIG. 3B, the semiconductor device package 100D is similar to the semiconductor device package 100C in FIG. 3A except that, for example, the conductive element 17 is disposed on the surface 121 and the redistribution structure 51 further includes a conductive layers 18b1 and b2 between the conductive layer 18a and the conductive element 17, while the conductive layer 16c' is omitted. The conductive layer 18b1 is electrically connected to the conductive layer 18a. The seed layer 17s is substantially conformal with the conductive element 17 and a protrusions 171 and 172 of the conductive element 17. The conductive layers 18b1 and 18b2 are respectively electrically connected to the conductive element 17 via the protrusions 171 and 172.

Figure 4A:
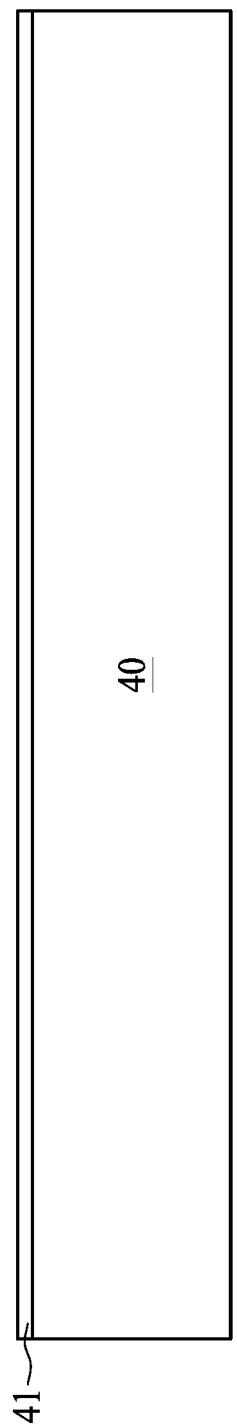
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N, FIG. 4O, FIG. 4P, FIG. 4Q, FIG. 4R, FIG. 4S, FIG. 4T, and FIG. 4U illustrate various stages of a method for manufacturing a semiconductor device package accordance with an embodiment.
Figure 4B:
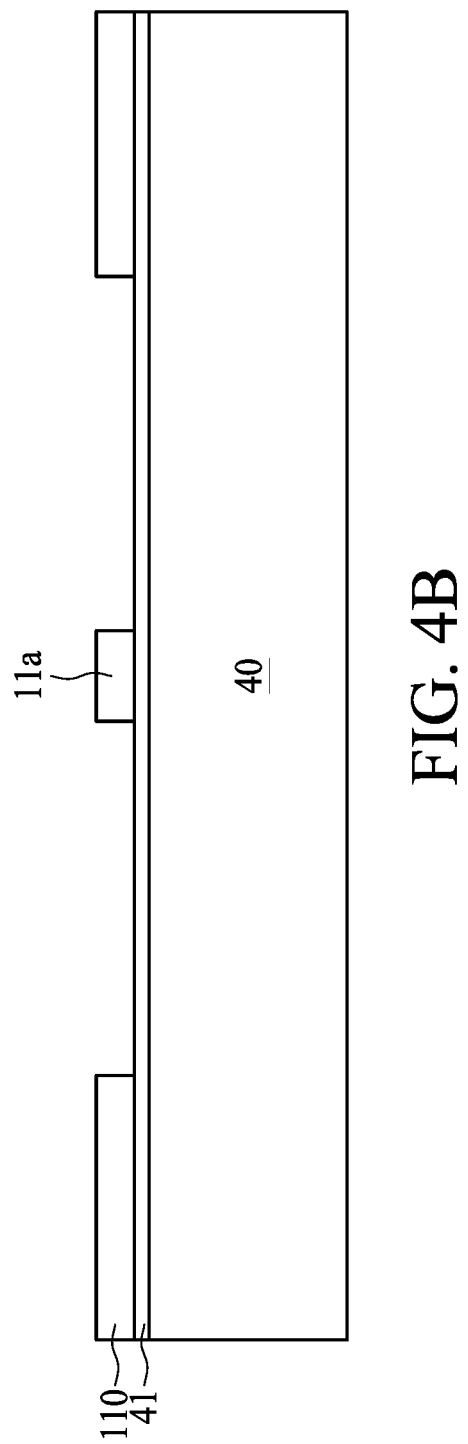
Figure 4C:
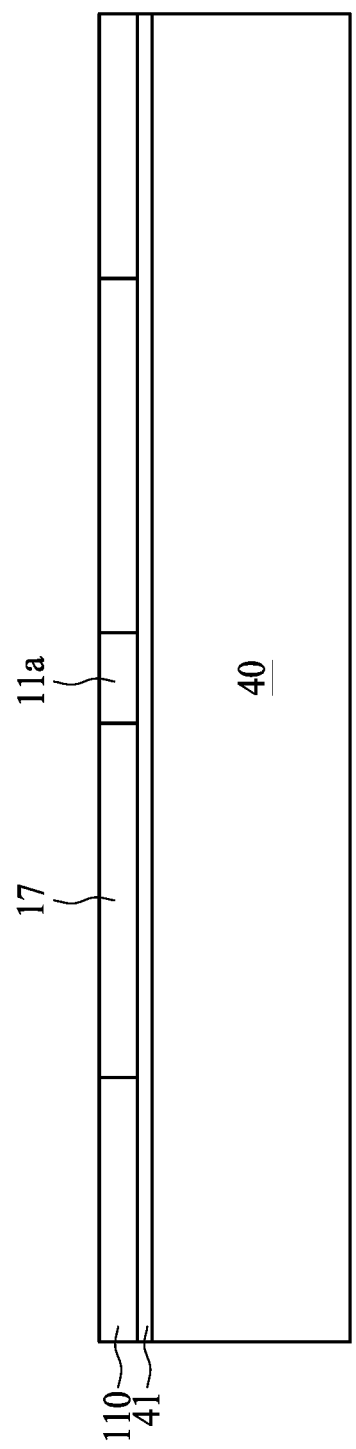
Figure 4D:
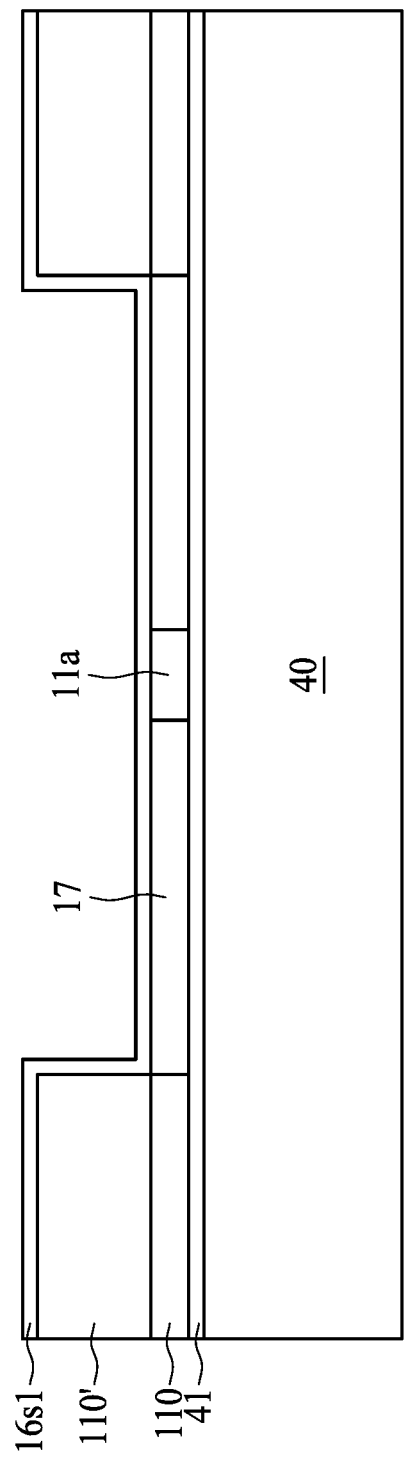
Figure 4E:
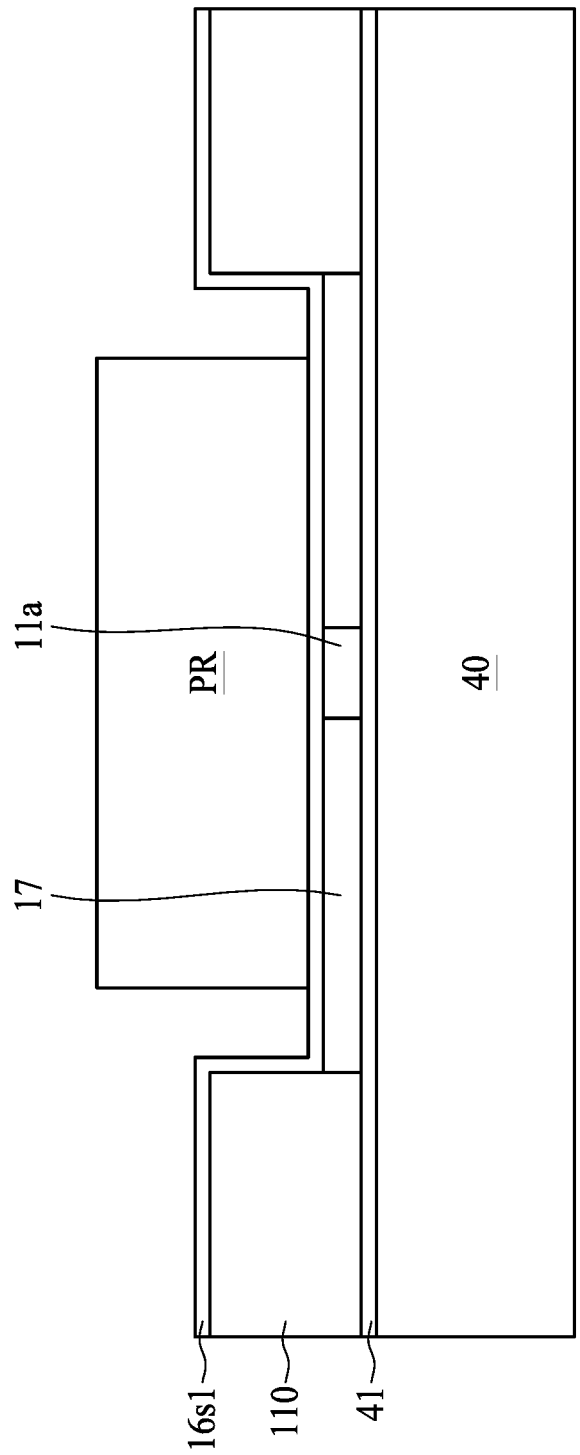
Figure 4F:
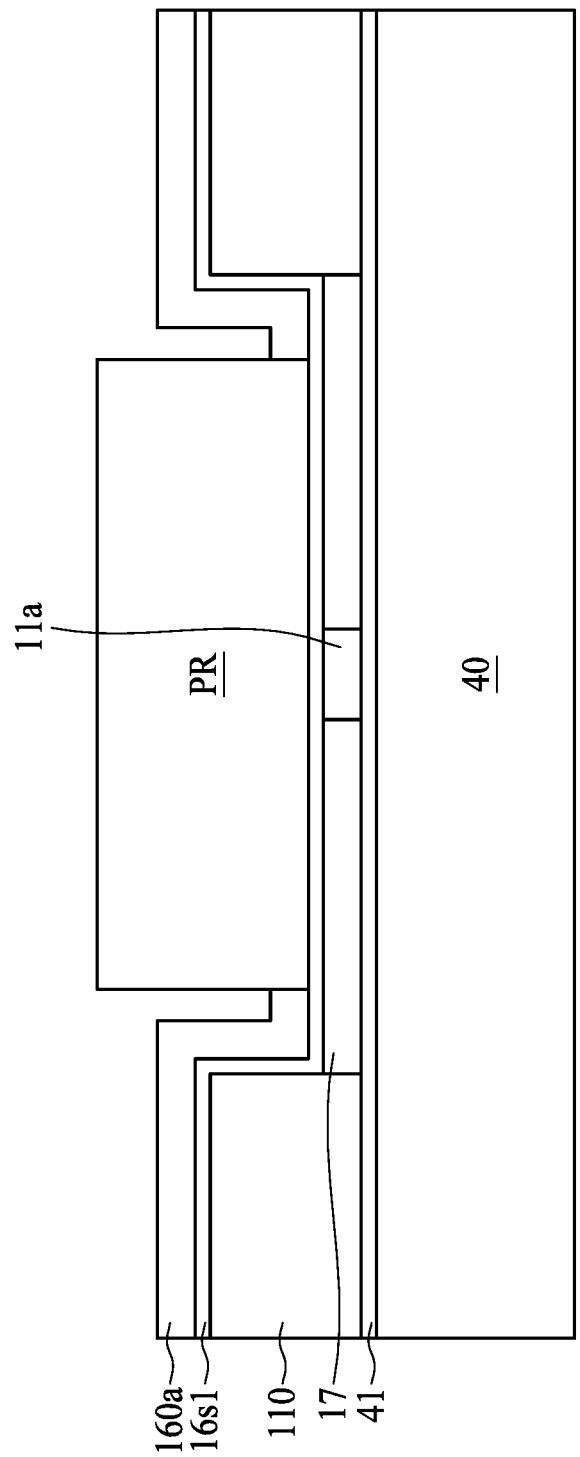
Figure 4G:
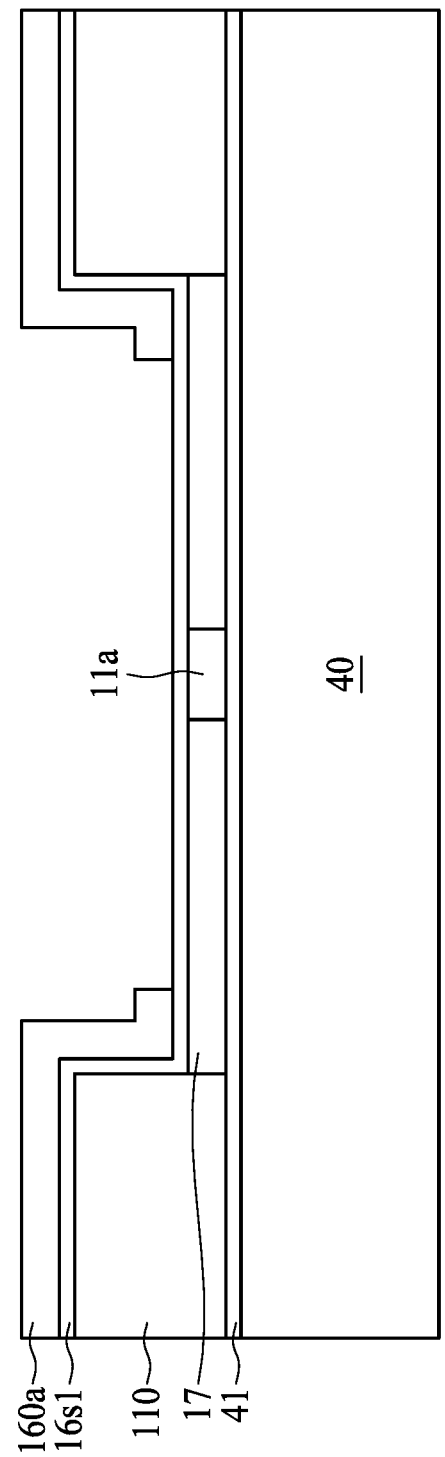
Figure 4H:
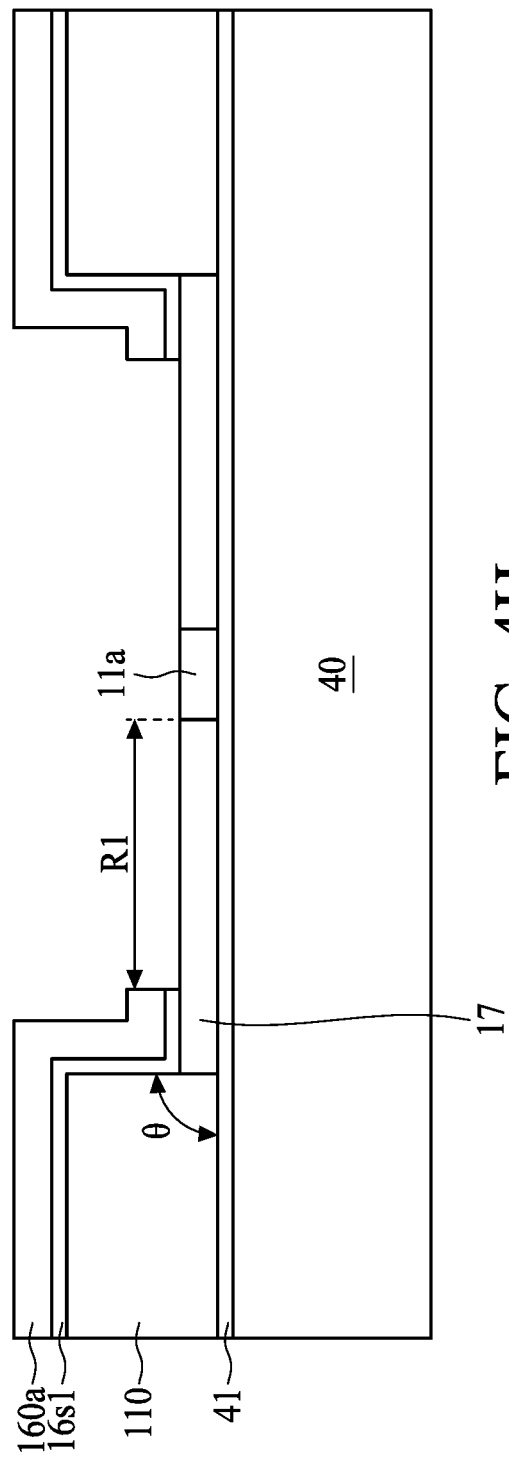
Figure 4I:
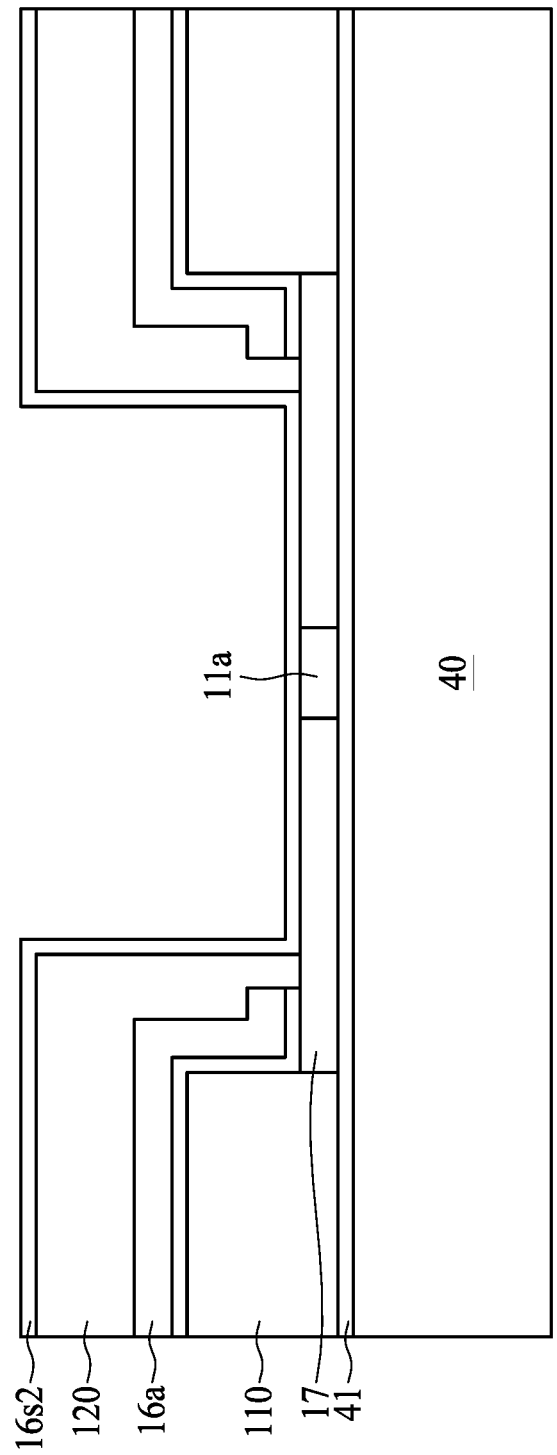
Figure 4J:
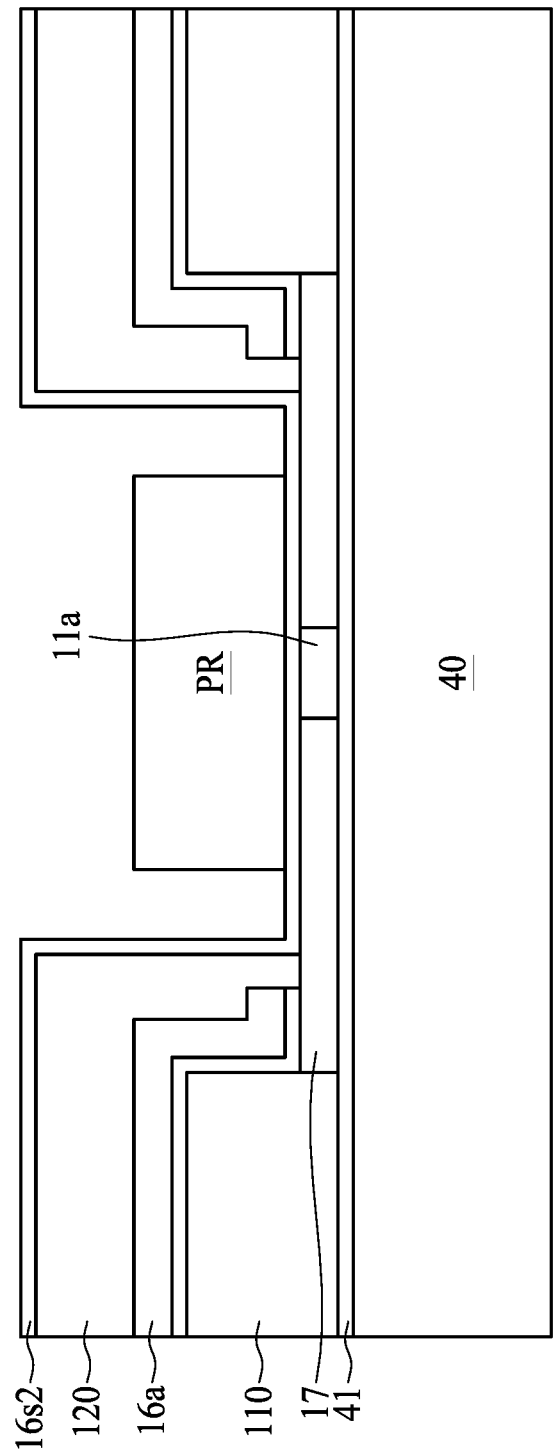
Figure 4K:
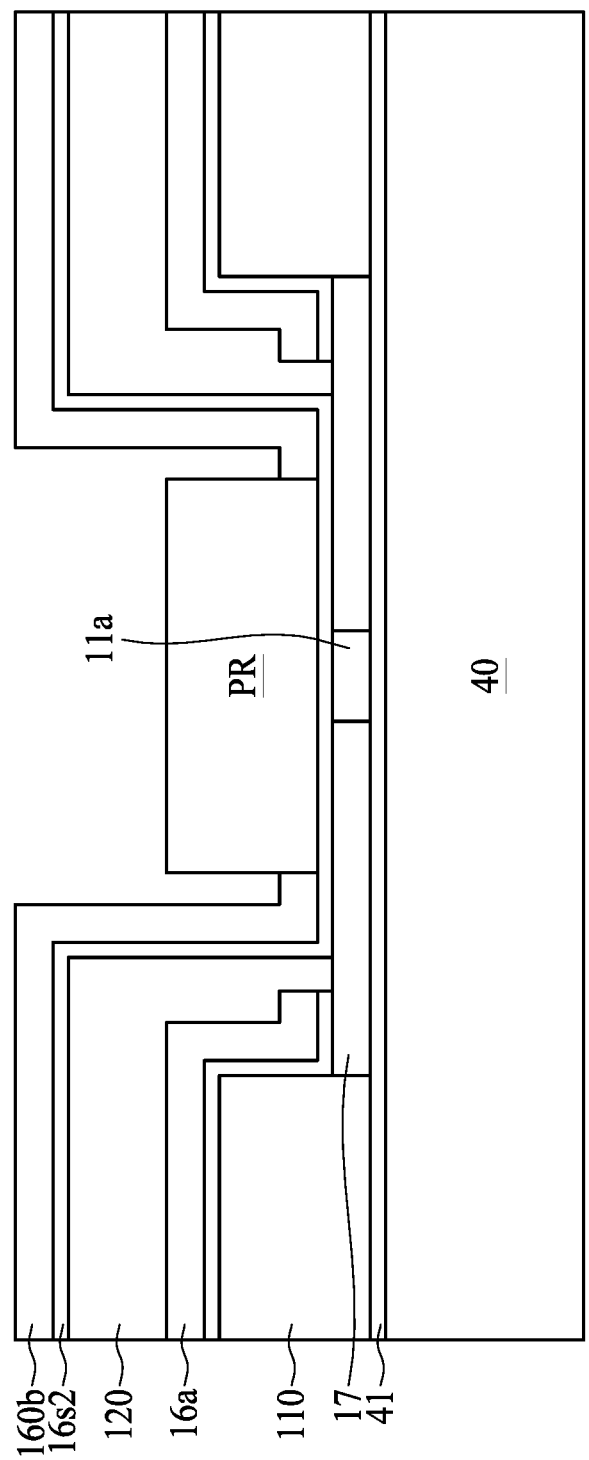
Figure 4L:
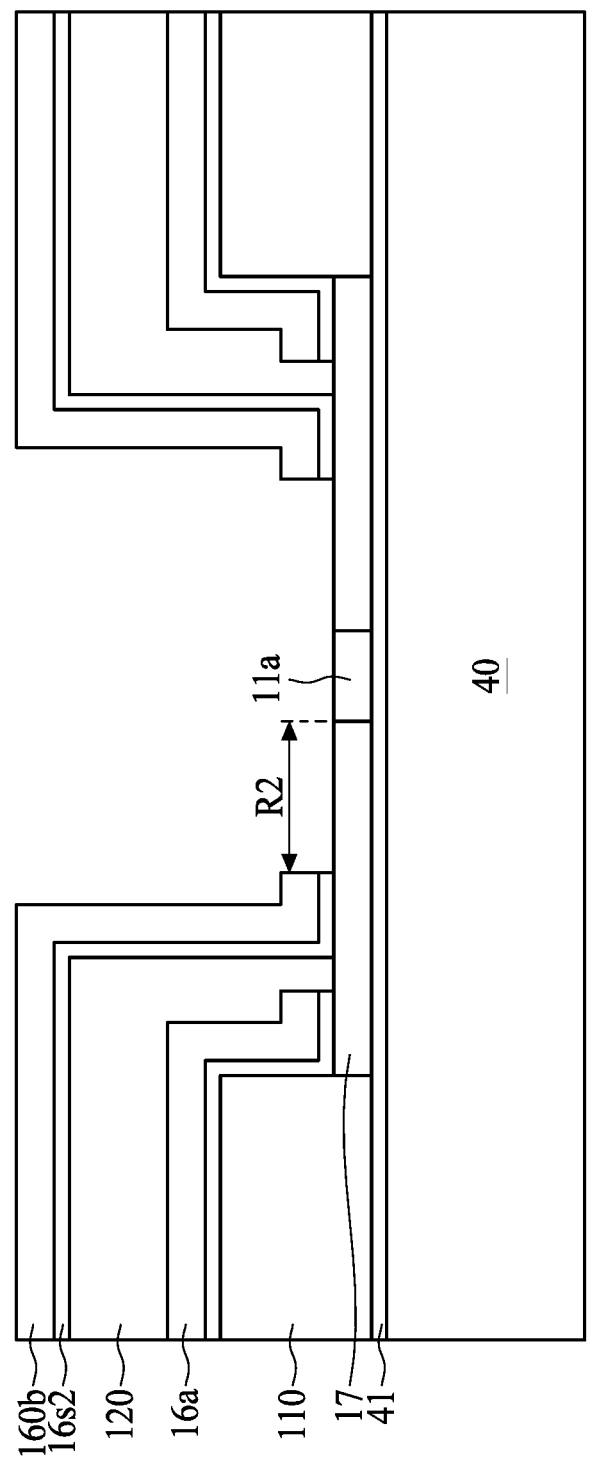
Figure 4M:
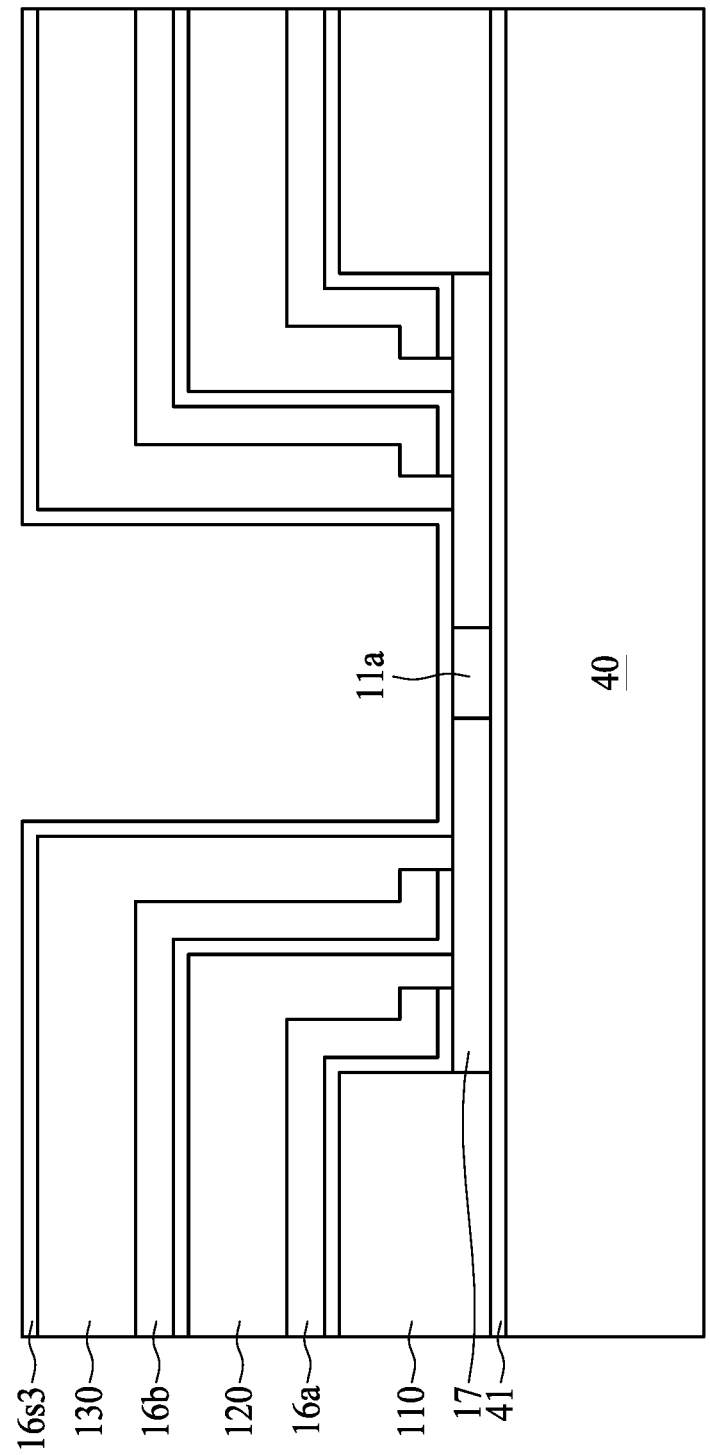
Figure 4N:
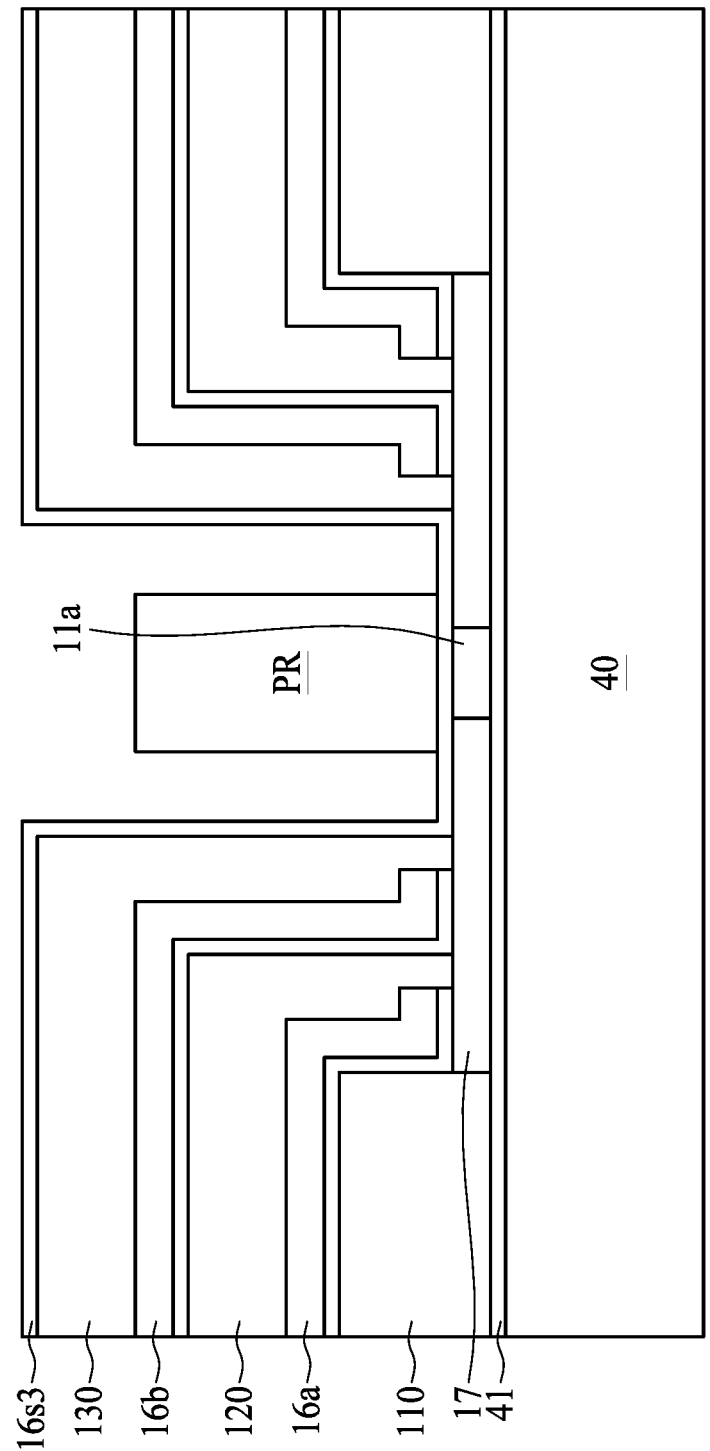
Figure 4O:
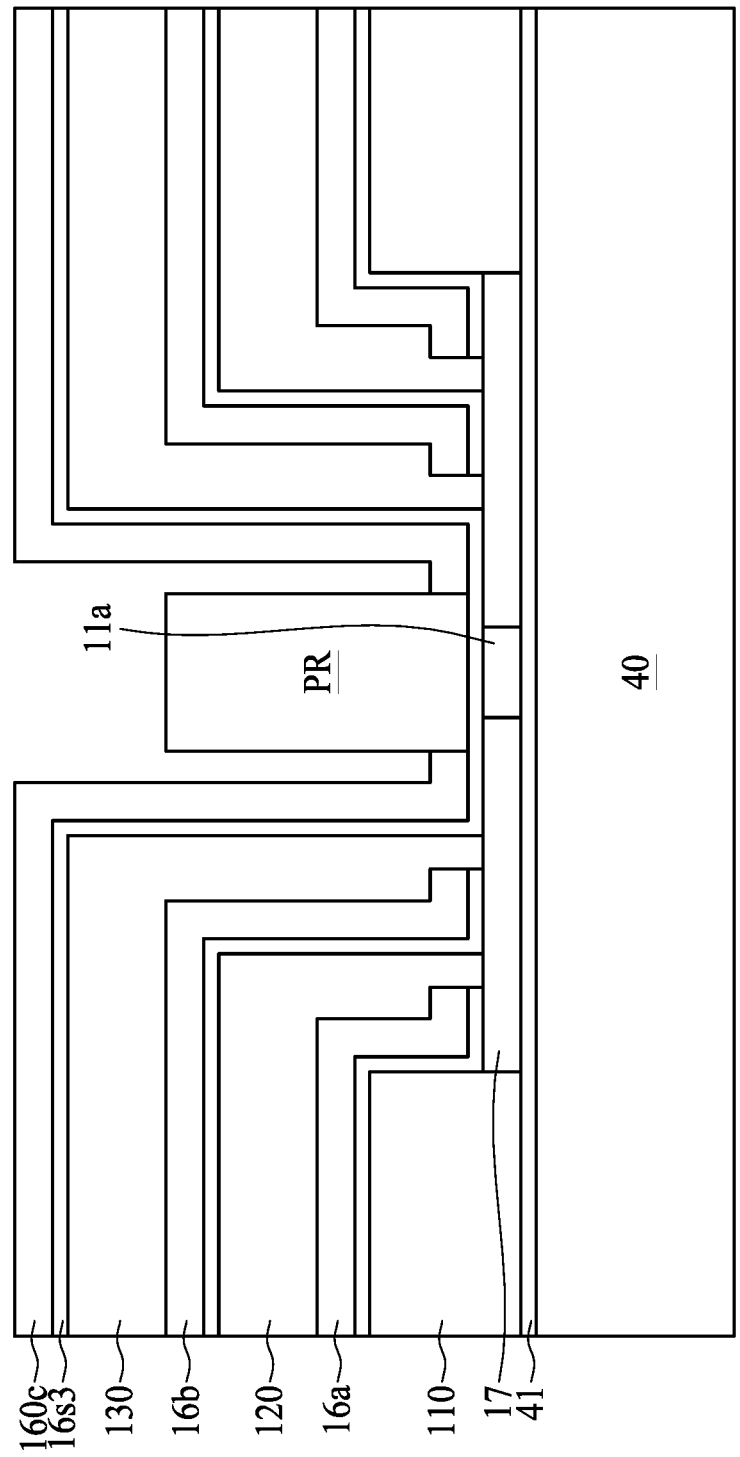
Figure 4P:
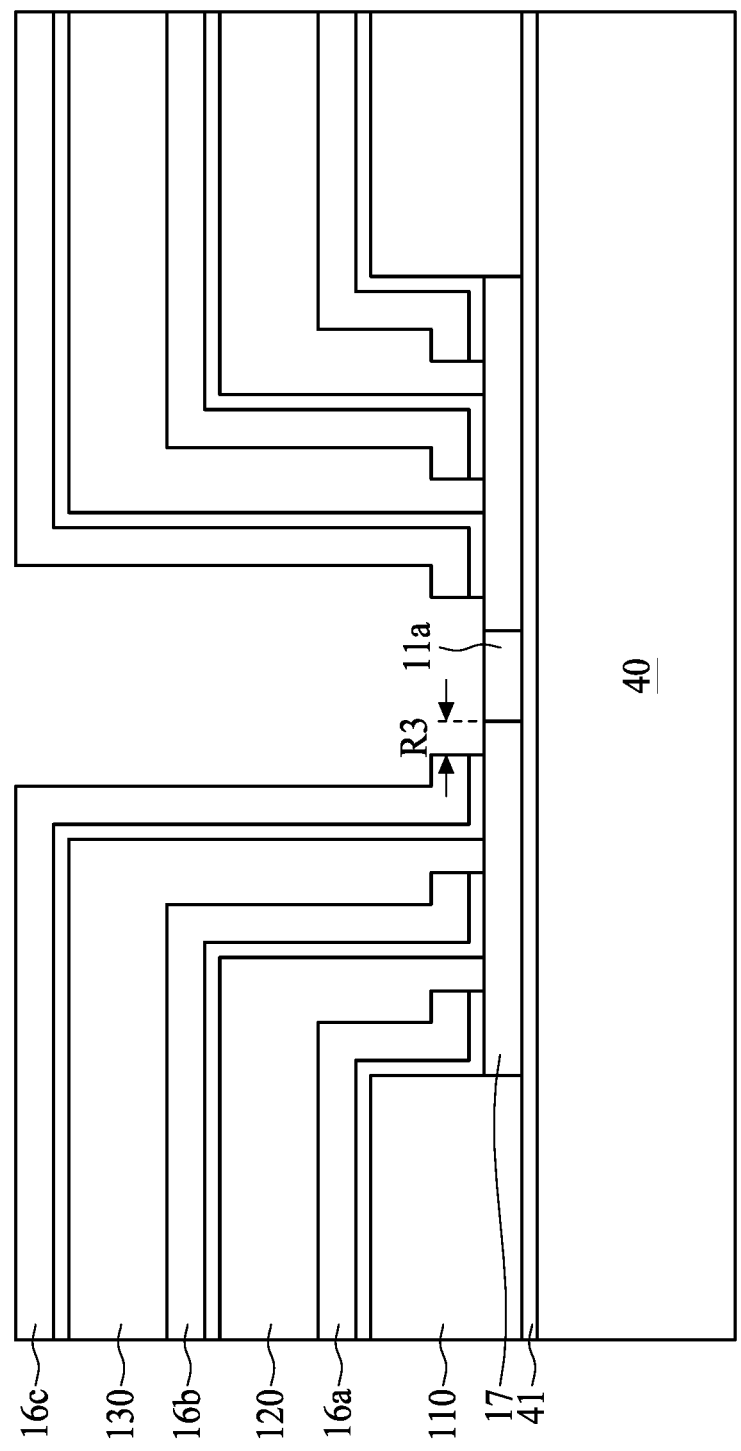
Figure 4Q:
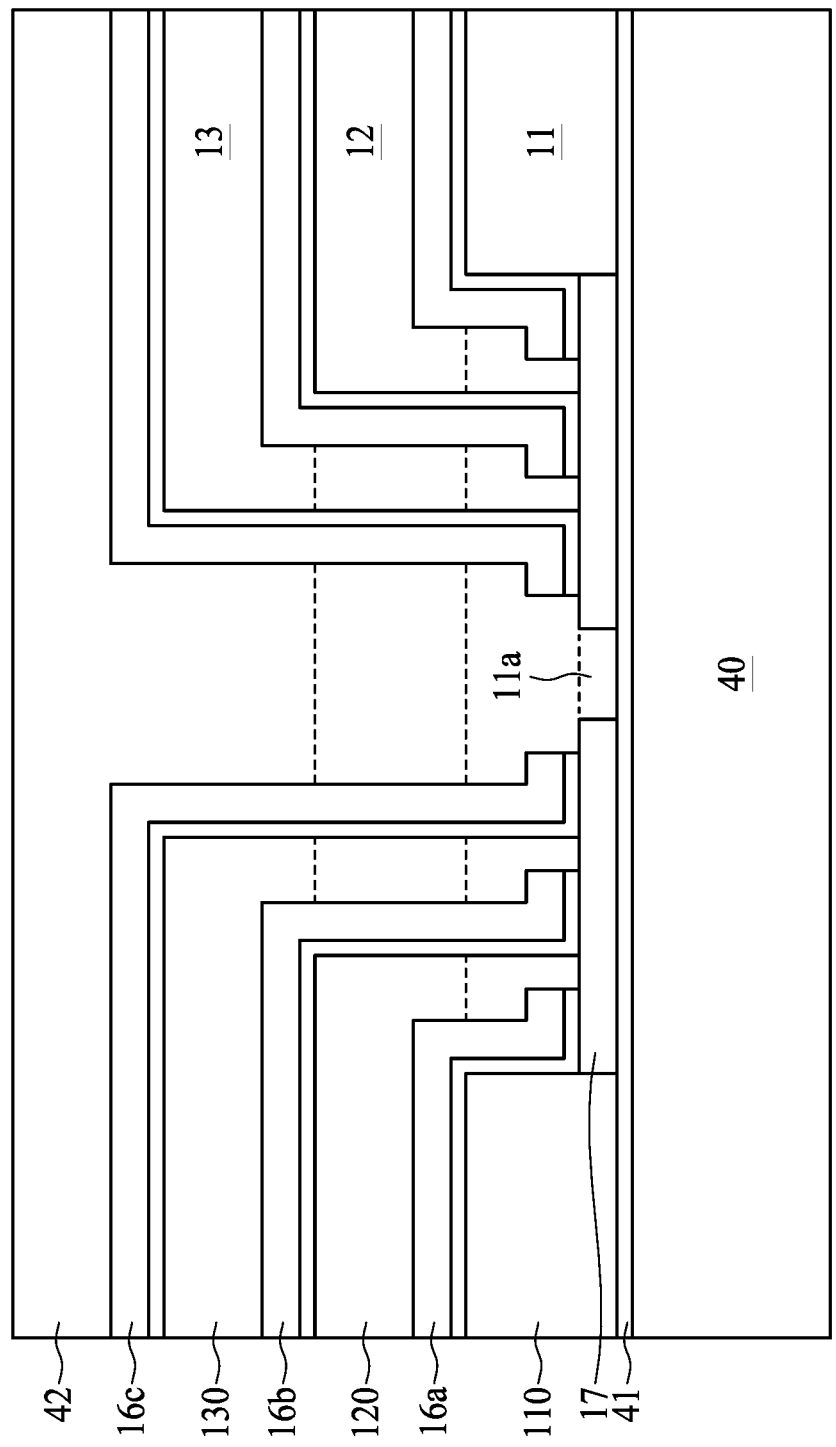
Figure 4R:
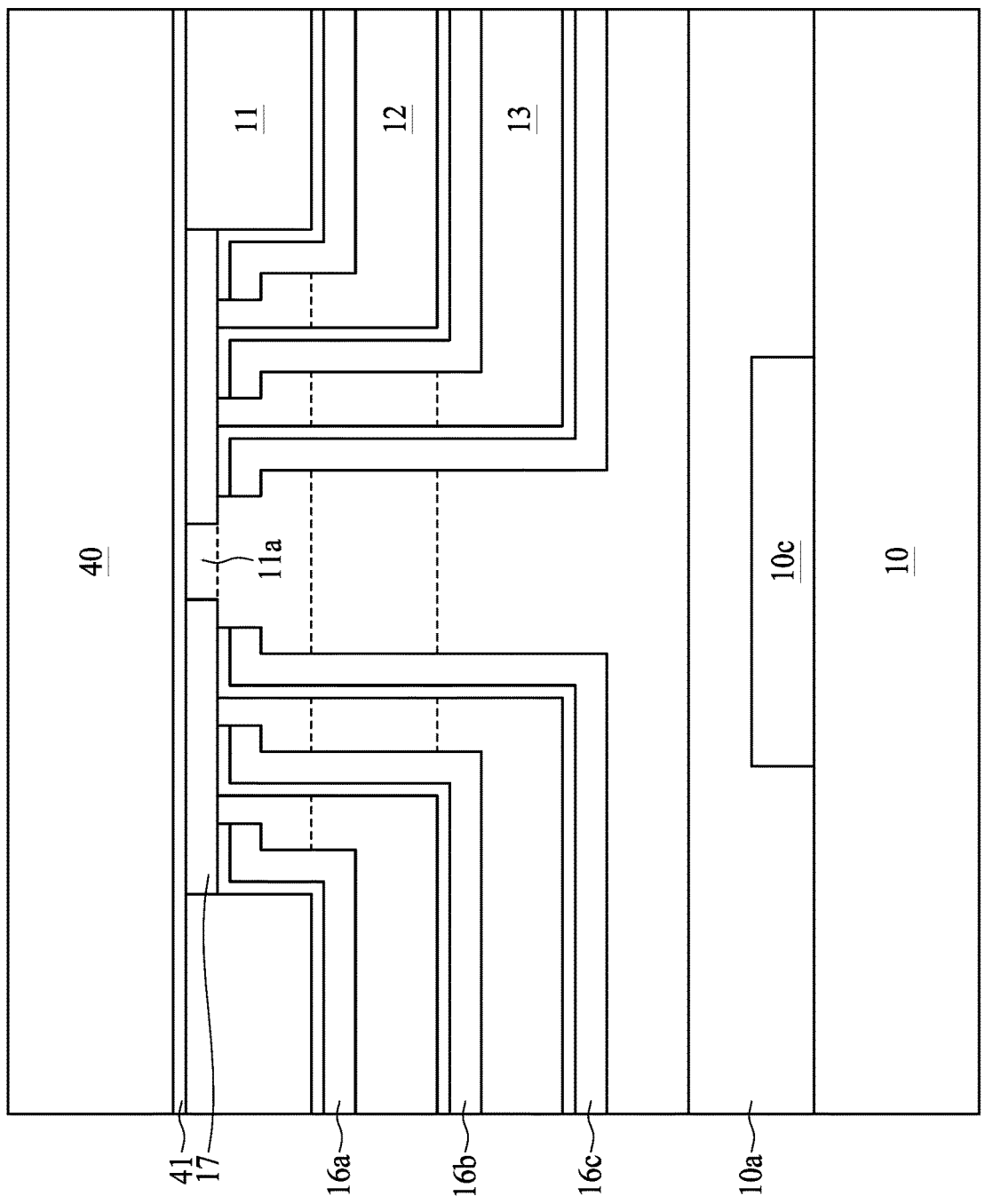
Figure 4S:
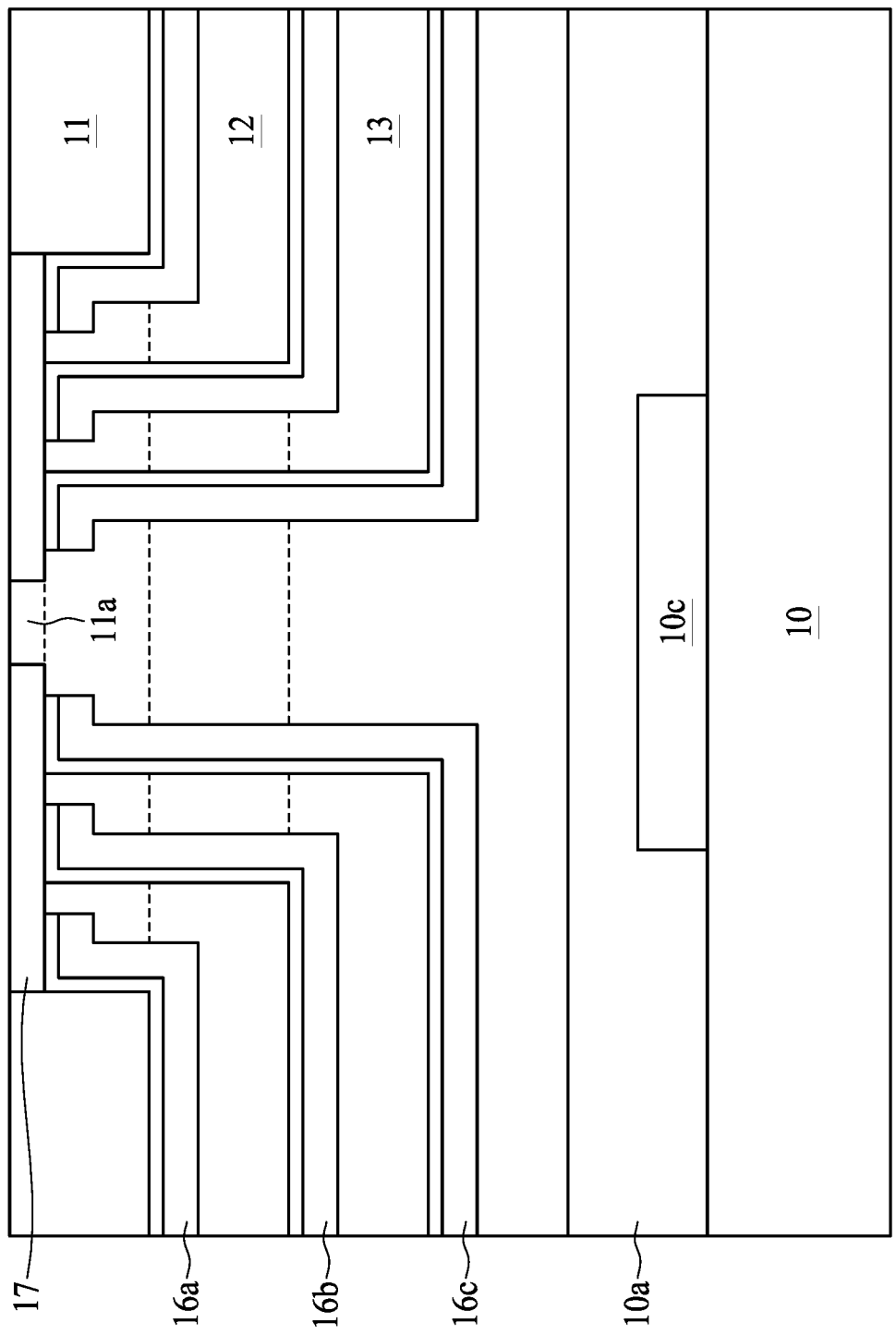
Figure 4T:
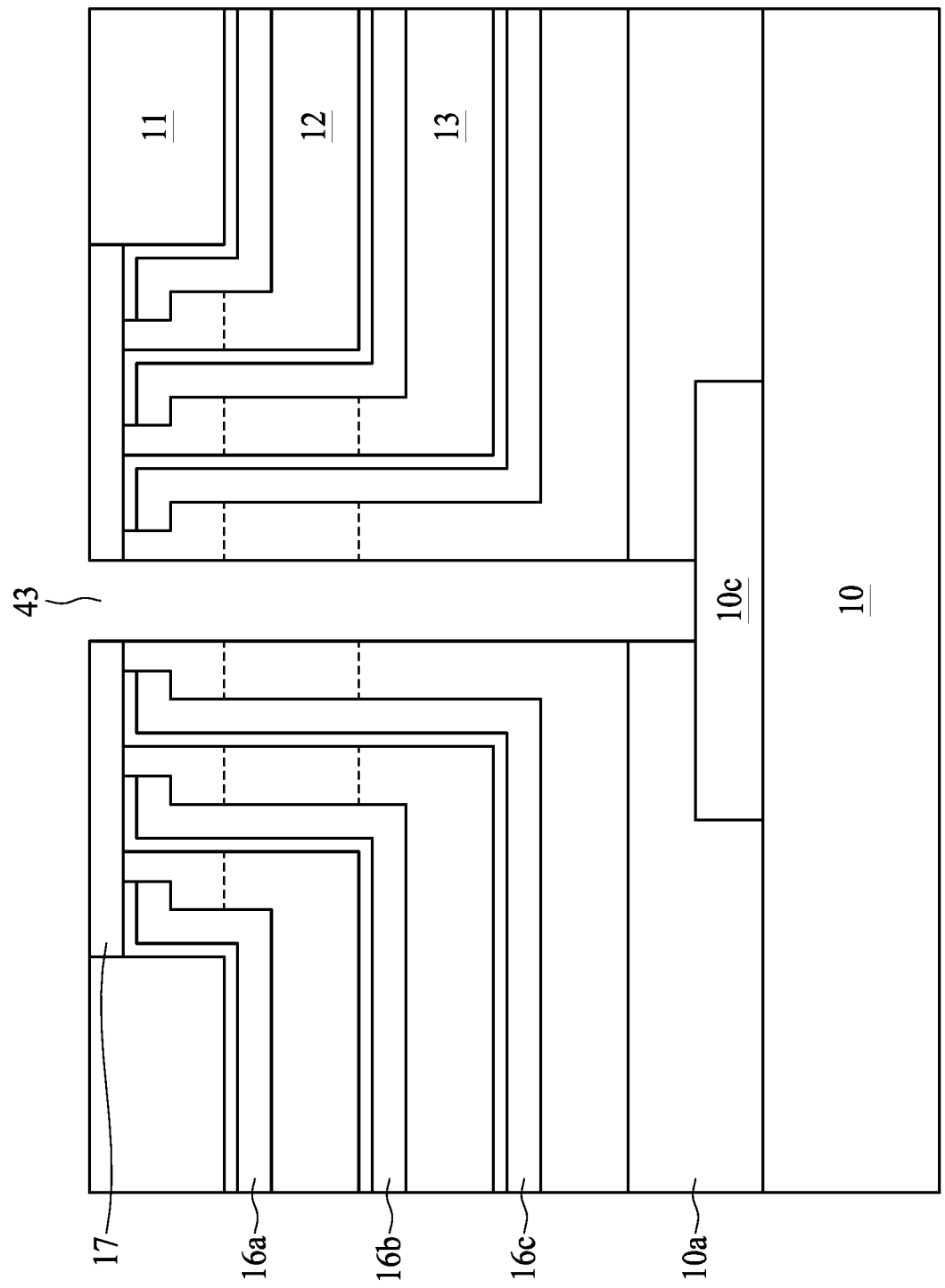
Figure 4U:
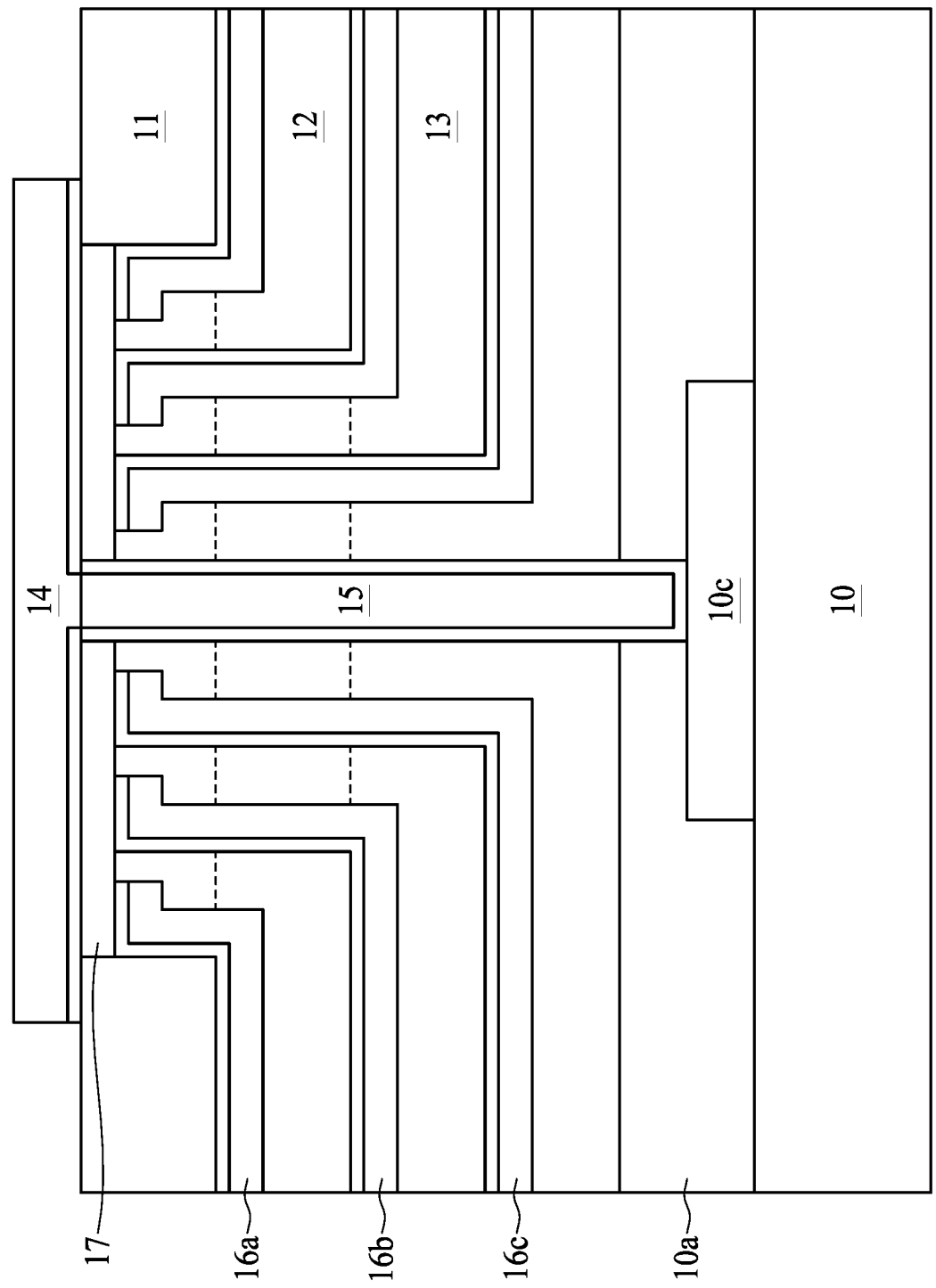

FIG. 4A through FIG. 4U illustrate various stages of a method for manufacturing a semiconductor device package in accordance with some embodiments of the present disclosure.

Referring to FIG. 4A, a carrier 40 is provided. The carrier 40 functions to support semiconductor components, devices or structures to be subsequently formed thereon. In an embodiment, the carrier 40 includes a paper-based copper foil laminate, a composite copper foil laminate, or a polymer-impregnated glass-fiber-based copper foil laminate.

Subsequently, a seed layer 41 is formed on the carrier 40 in, for example, a physical vapor deposition (PVD) process. The seed layer 41 functions to provide a barrier between metal material and dielectric material.

Referring to FIG. 4B, a patterned first dielectric layer 110 is formed on the seed layer 41 by using, for example, a coating process followed by a lithographic process. The patterned first dielectric layer 110 includes an island region 11a, and exposes a portion of the seed layer 41 not covered by the island region 11a.

Referring to FIG. 4C, a first conductive layer 17 is formed on the exposed portion of the seed layer 41 by, for example, a plating process. The first conductive layer 17 is lower than the patterned first dielectric layer 110. The conductive layer 17 serves as the conductive element 17 as illustrated in FIG. 1A, and thus is referred to as the conductive element 17 hereinafter.

Referring to FIG. 4D, another patterned dielectric layer 110' is formed on the patterned first dielectric layer 110 except the island region 11a to increase the total thickness of the first patterned dielectric layer 110. Next, a seed layer 16s1 is formed on the first dielectric layer 110, conductive layer 17 and the island region 11a in, for example, a PVD process.

Referring to FIG. 4E, a photoresist PR is formed over the conductive element 17 and the island region 11a by, for example, a coating process followed by an exposure process. Referring to FIG. 4F, a conductive layer 160a is formed on the seed layer 16s1 exposed from the photoresist PR. The conductive layer 160a and seed layer 16s1 collectively indicated as the first conductive layer 16a as illustrated in FIG. 1A.

Referring to FIG. 4G, the photoresist PR is removed by, for example, a plasma ashing process, exposing a portion of the seed layer 16s1 not covered by the conductive layer 160a. Referring to FIG. 4H, the exposed region of the seed layer 16s1 is removed by, for example, a wet cleaning process. Afterwards, a first region of the conductive element 17 with a radius R1 and the island region 11a are exposed.

Furthermore, to facilitate manufacturing, an angular relation between the first patterned dielectric layer 110 and the first conductive layer 16a may be determined. In particular, the a bottom surface of the first patterned dielectric layer 110 and a lateral surface of the first conductive layer 16a define an angle $\Theta$. The angle $\Theta$ may exceed 47° The angle $\Theta$ may exceed 65°. The angle $\Theta$ may exceed 73°. The angle $\Theta$ may exceed 77°. The angle $\Theta$ may exceed 79°. The angle $\Theta$ may be in the range from 81° to 91°. The angle $\Theta$ can prevent the discontinuous profile of the electroplated material in the PVD process for the seed layer 16s.

Referring to FIG. 4, a patterned second dielectric layer 120 is formed on the first conductive layer 16a1 and a portion of the conductive element 17 by using, for example, a coating process followed by a lithographic process. Next, a seed layer 16s2 is formed on the patterned second dielectric layer 120, conductive element 17 and the island region 11a in, for example, a PVD process.

Referring to FIG. 4J, a photoresist PR is formed over the conductive element 17 and the island region 11a by, for example, a coating process followed by a exposure process. Referring to FIG. 4K, a conductive layer 160b is formed on the seed layer 16s2 exposed from the photoresist PR. The conductive layer 160b and seed layer 16s2 collectively indicated as the second conductive layer 16b as illustrated in FIG. 1B.

Referring to FIG. 4L, the photoresist is removed by, for example, a plasma ashing process, exposing a portion of the seed layer 16s2 not covered by the conductive layer 160a. Next, the exposed region of the seed layer 16s2 is removed by, for example, a wet cleaning process. Afterwards, a second region of the conductive element 17 with a radius R2 and the island region 11a are exposed.

Referring to FIG. 4M, a patterned third dielectric layer 130 is formed on the second conductive layer 16b and a portion of the conductive element 17 by using, for example, a coating process followed by a lithographic process. Next, a seed layer 16s3 is formed on the patterned third dielectric layer 120, conductive layer 17 and the island region 11a in, for example, a PVD process.

Referring to FIG. 4N, a photoresist PR is formed over the conductive element 17 and the island region 11a by, for example, a coating process followed by a exposure process. Referring to FIG. 4O, a conductive layer 160c is formed on the seed layer 16s3 exposed from the photoresist PR. The conductive layer 160c and seed layer 16s3 are collectively indicated as the third conductive layer 16c as illustrated in FIG. 1B.

Referring to FIG. 4P, the photoresist is removed by, for example, a plasma ashing process, exposing a portion of the seed layer 16s1 not covered by the conductive layer 160a. Next, the exposed region of the seed layer 16s3 is removed by, for example, a wet cleaning process. Afterwards, a third region of the conductive element 17 with a radius R3 and the island region 11a are exposed. In an embodiment, the radius D1 is greater than the radius D2 and the radius D2 is greater than the radius D3.

Referring to FIG. 4Q, a dielectric layer 42 is formed on the third conductive layer 16c, the conductive element 17, and the island region 11a by using, for example, a coating process followed by a grinding process. The first patterned dielectric layer 110, a bottom portion of the second patterned dielectric layer 120, a bottom portion of the third patterned dielectric layer 130 and a bottom portion of the dielectric layer 42 are collectively indicated as the first dielectric layer 11 as illustrated in FIG. 1A. A top portion of the second dielectric layer 120, a middle portion of the third dielectric layer 130 and a middle portion of the dielectric layer 42 are collectively indicated as the second dielectric layer 12 as illustrated in FIG. 1A. A top portion of the third dielectric layer 130 and a top portion of the dielectric layer 42 are collectively indicated as the third dielectric layer 13 as illustrated in FIG. 1A.

Referring to FIG. 4R, a substrate 10 is provided and subsequently attached to the third dielectric layer 13 by an adhesive layer 10a. The substrate 10 includes a conductive pad 10c. Referring to FIG. 4S, the carrier 40 and the seed layer 41 are removed.

Referring to FIG. 4T, an opening 43 is formed by drilling through the island region 11a, the first, second, and third dielectric layers 11, 12, and 13 and ends on the conductive pad 10c by, for example, a $CO_2$ laser drilling. The $CO_2$ laser has a relatively low etch rate to the conductive element 17, so the conductive element 17 may be a hard mask in the laser drilling. In laser drilling, using the conductive element 17 as a hard mask provides the opening 43 with a continuous profile. In addition, using the conductive element 17 as a hard mask provides the opening 43 with a relatively small diameter. The opening 43 with a relatively small diameter provides a relatively large design window for the circuitry embedded in the first, second, or third dielectric layers 11, 12, or 13.

Referring to FIG. 4U, a seed layer 15s is formed to contour the opening 43 in, for example, a PVD process. A seed layer 14s is formed on the conductive element 17 in, for example, a PVD process. The seed layer 15s and seed layer 14s may be formed at the same time. Afterwards, a conductive pad 14 is formed on the seed layer 14s in, for example, a plating process. A conductive via 15 is formed on the seed layer 15s, filling the opening by. for example, a plating process. In an embodiment, the conductive via 15 and the conductive pad 14 may be formed by plating Cu, Ag, Ni, Au, or a suitable metal. In some embodiments, the conductive pad 14 may be directly formed on the conductive element 17 without the seed layer 14s by, for example, an electroless plating. In some embodiments, the conductive via 15 may be directly formed in the opening 43 without the seed layer 15 by, for example, an electroless plating.

FIG. 5A through FIG. 5H illustrate various stages of a method for manufacturing a semiconductor package assembly 200A of FIG. 1D.

Figure 5A:
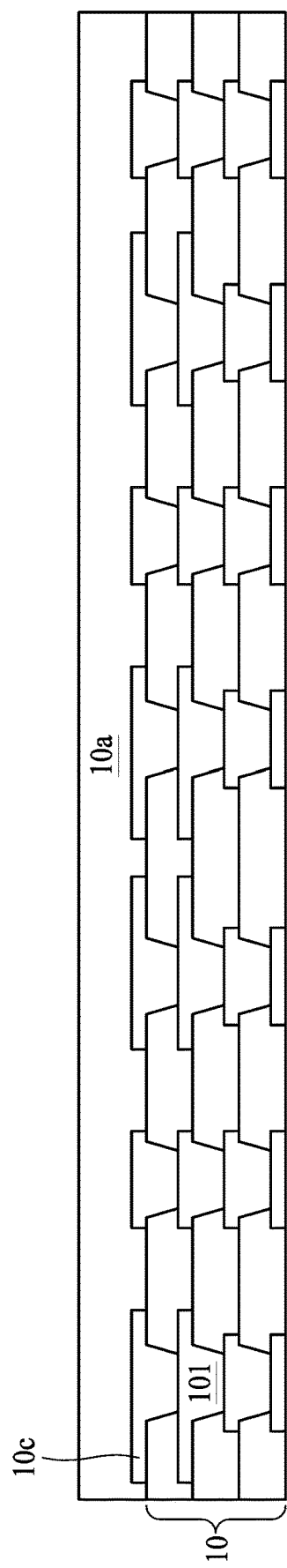
FIG. 5A, FIG. 5B, FIG. 5C, FIG. 5D, FIG. 5E, FIG. 5F, FIG. 5G, and FIG. 5H illustrate various stages of a method for manufacturing a semiconductor package assembly of FIG. 1D.

Referring to FIG. 5A, a substrate 10 is provided. The substrate 10 includes a plurality of interconnection structures 101 and a plurality of conductive pads 10c. An adhesive layer 10a is disposed on the substrate 10.

Figure 5B:
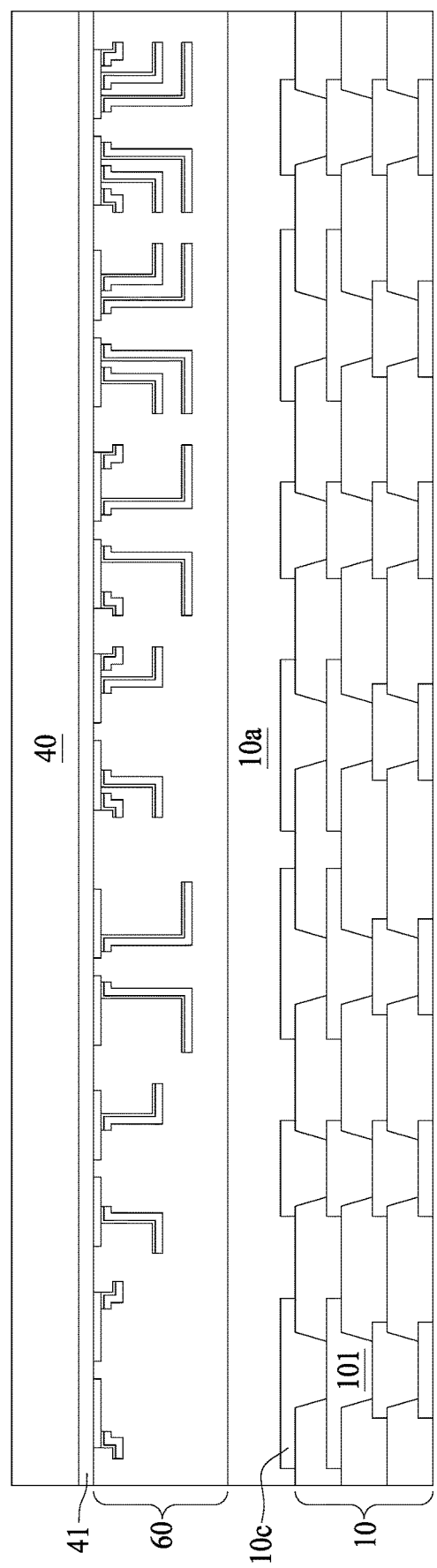
Figure 5C:
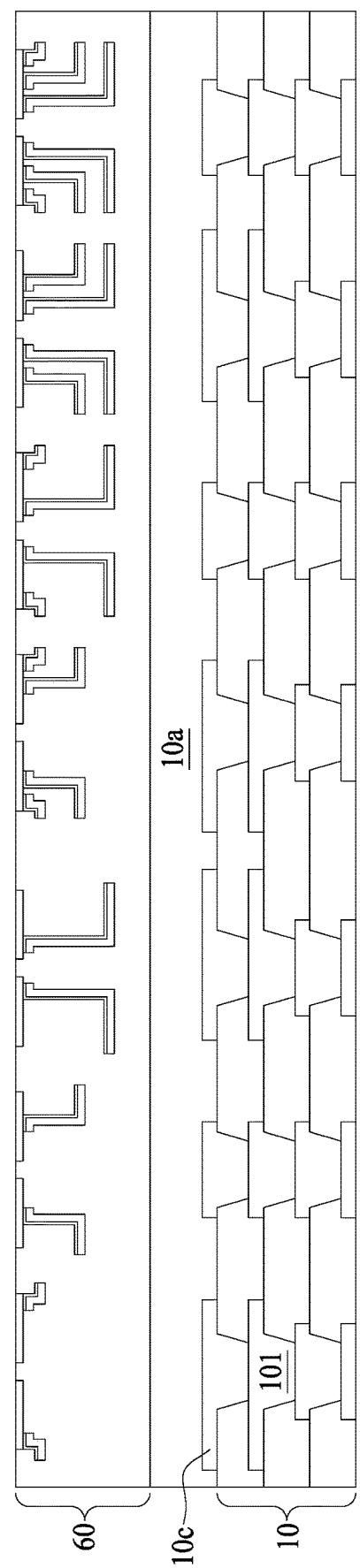

Referring to FIG. 5B, a redistribution structure 60 attached on a carrier 40 via a seed layer 41 is provided. The redistribution structure 60 is attached on the substrate 10 via the adhesive layer 10a by using, for example, a flip-chip bonding (FCB) process. The redistribution structure 60 includes variations of the structure as illustrated in FIG. 4Q. Referring to FIG. 5C, the carrier 40 and the seed layer 41 are removed.

Figure 5D:
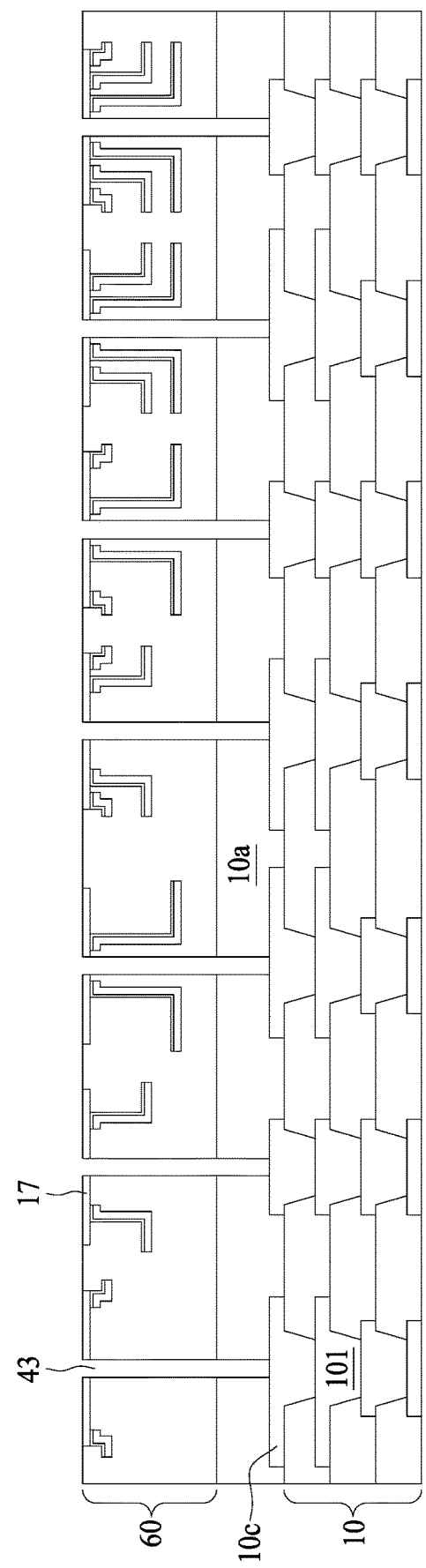

Referring to FIG. 5D, a plurality of openings 43 are formed by using, for example, a $CO_2$ laser drilling process. In a $CO_2$ laser drilling process, the conductive element 17 functions as a hard mask, and the conductive layers (e.g. the first, second, and third conductive layers) remain intact from the $CO_2$ laser. Therefore, given that the layouts in the redistribution structure 60 in each region are different, the shape of each of the plurality of openings 43 is substantially the same. Advantageously, the setting for the recipe of the laser drilling process can be simplified, and the throughput of the laser drilling process can be increased.

Figure 5E:
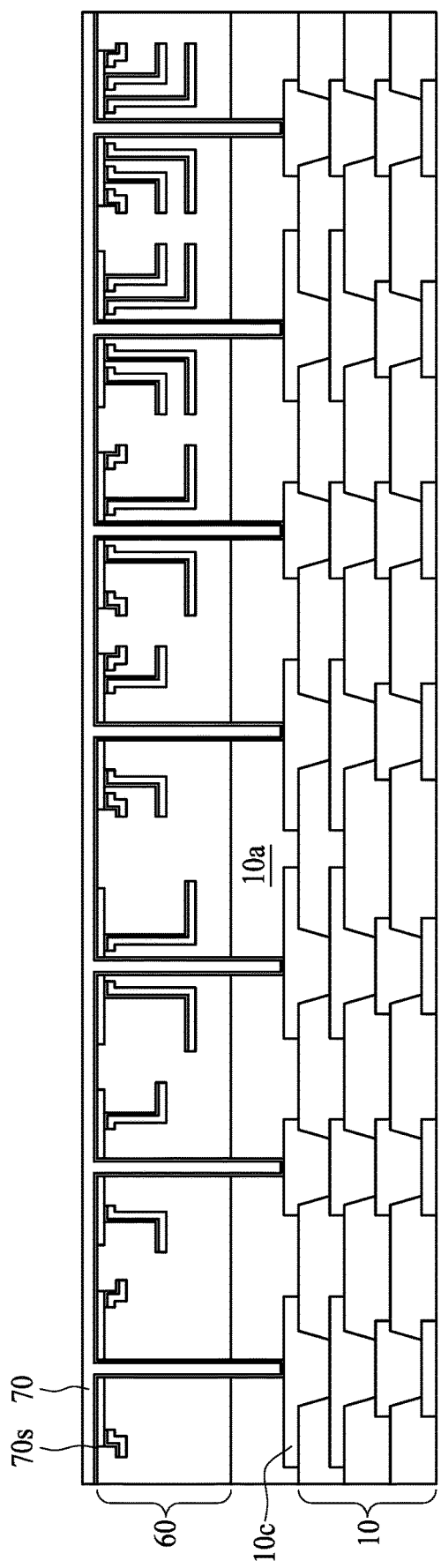
Figure 5F:
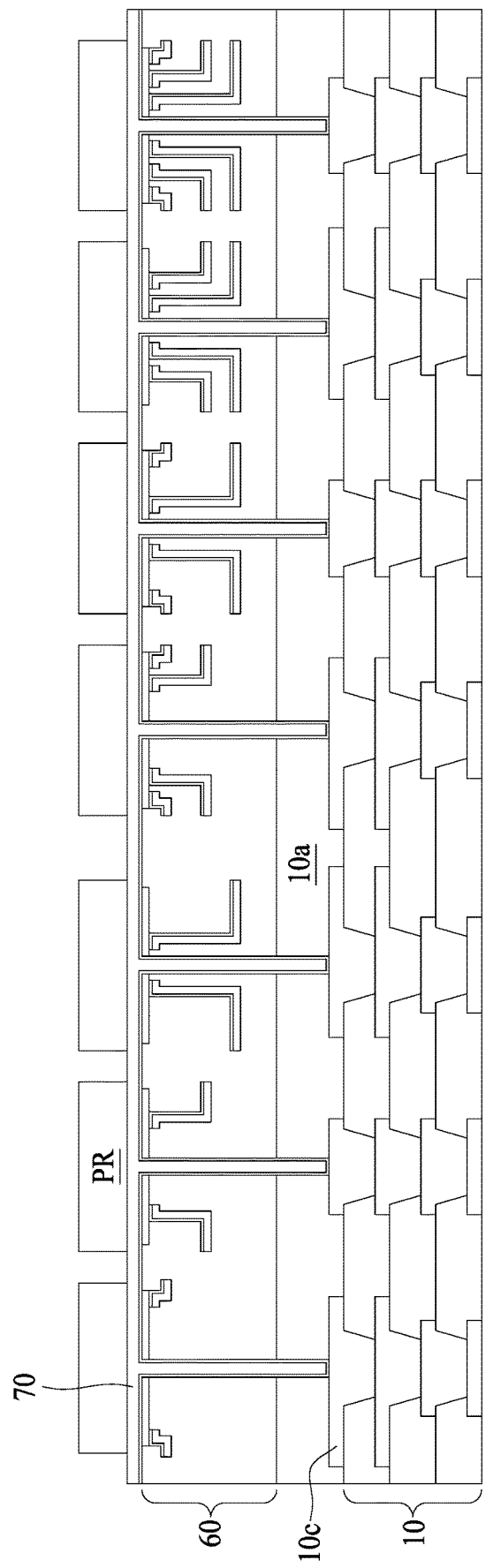
Figure 5G:
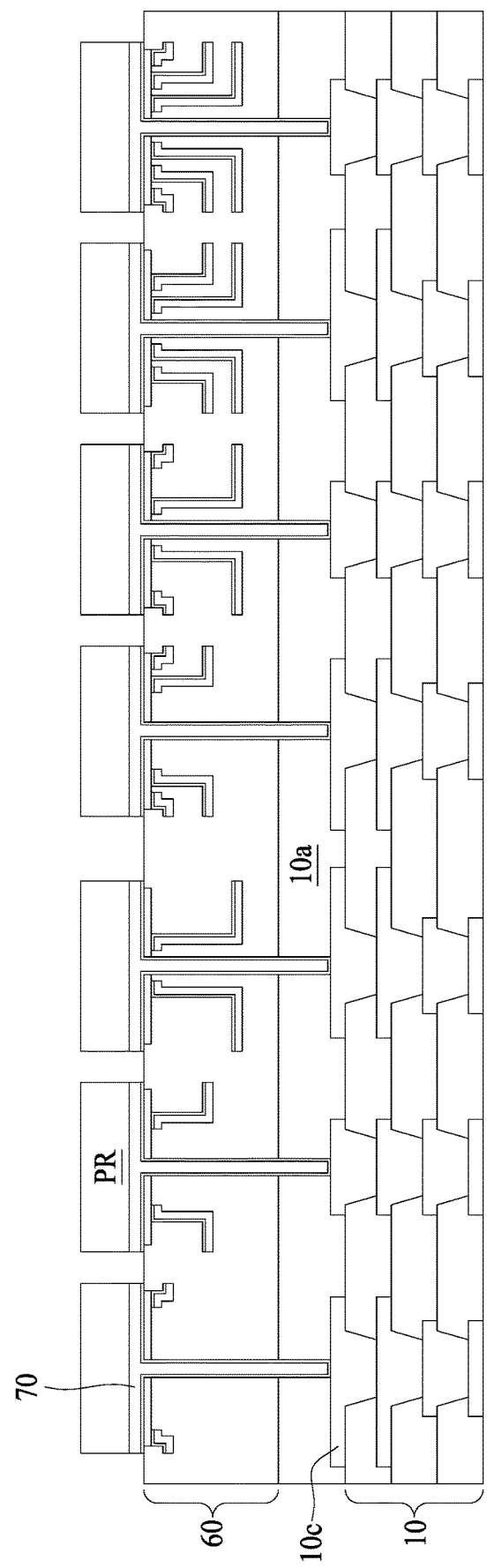
Figure 5H:
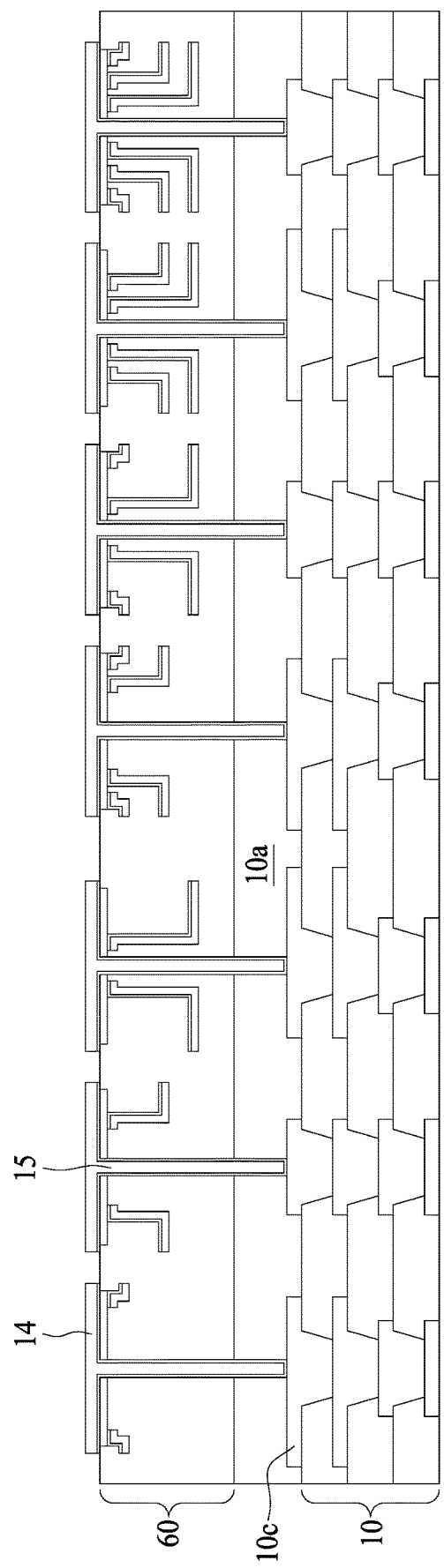

Referring to FIG. 5E, a conductive structure 70 is disposed in the openings and the surface of the redistribution structure 60. The conductive structure 70 includes a seed layer 70s. Referring to FIG. 5F, a photoresist PR is formed on the conductive structure 70 by, for example, a coating process followed by an exposure process. Referring to FIG. 5G, the exposed region of the conductive structure 70 is removed by, for example, a wet etching process. As a result, a plurality of conductive pads 14 and a plurality of conductive vias 15 are defined. Referring to FIG. 5H, the photoresist PR is removed by, for example, a plasma ashing process.

Afterwards, one or more semiconductor devices may be attached on the conductive pads 14 via a plurality of connection elements (e.g. solders). Furthermore, another plurality of connection elements may be disposed on the substrate 10 to form the semiconductor device package 10D described and illustrated with reference to FIG. 1D.

FIG. 6A through FIG. 6D illustrate various stages of a method for manufacturing a semiconductor device package 100C of FIG. 3A.

Referring to FIG. 6A, a carrier 40 is provided. A seed layer 41 is formed on the carrier 40. A dielectric layer is formed on the seed layer 41. A conductive layer 18a is disposed on the dielectric layer. Another dielectric layer is formed on the conductive layer 18a and is patterned to form a trench t1, exposing a portion of the conductive layer 18a. The two dielectric layers are collectively referred to as a dielectric layer 11.

Figure 6B:
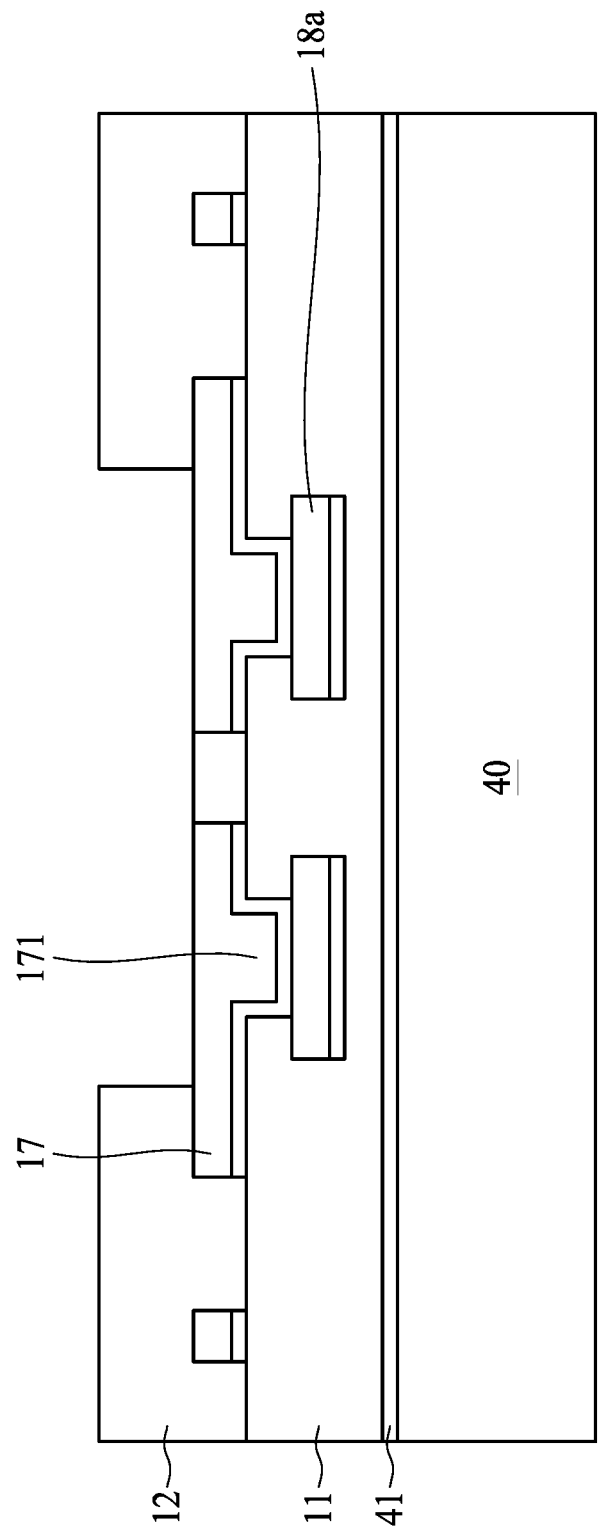

Referring to FIG. 6B, a conductive element 17 is formed on the dielectric layer 11. The conductive element 17 includes a protrusion 171 formed in the trench t1. The patterned dielectric layer 12 is formed on the dielectric layer 11 and a portion of the conductive element 17.

Figure 6C:
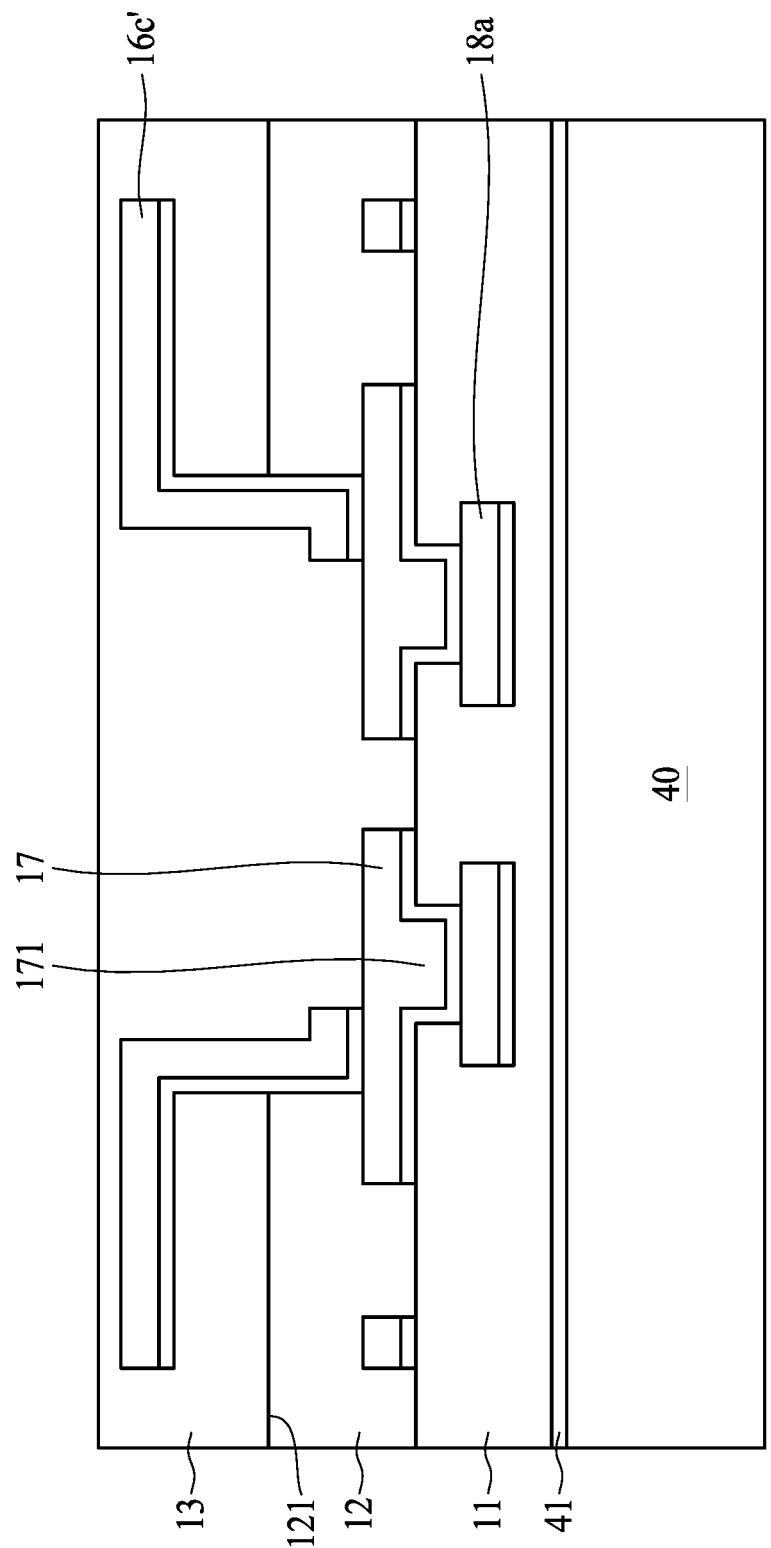

Referring to FIG. 6C, a dielectric layer is formed on a surface 121 of the dielectric layer 12. A conductive layer 16c' is formed on the dielectric layer in a method similar to those as illustrated in FIGS. 4C to 4H. The conductive layer 16c contacts the conductive element 17. Next, another dielectric layer is formed to cover the conductive element 17 and the conductive layer 16c'.

Figure 6D:
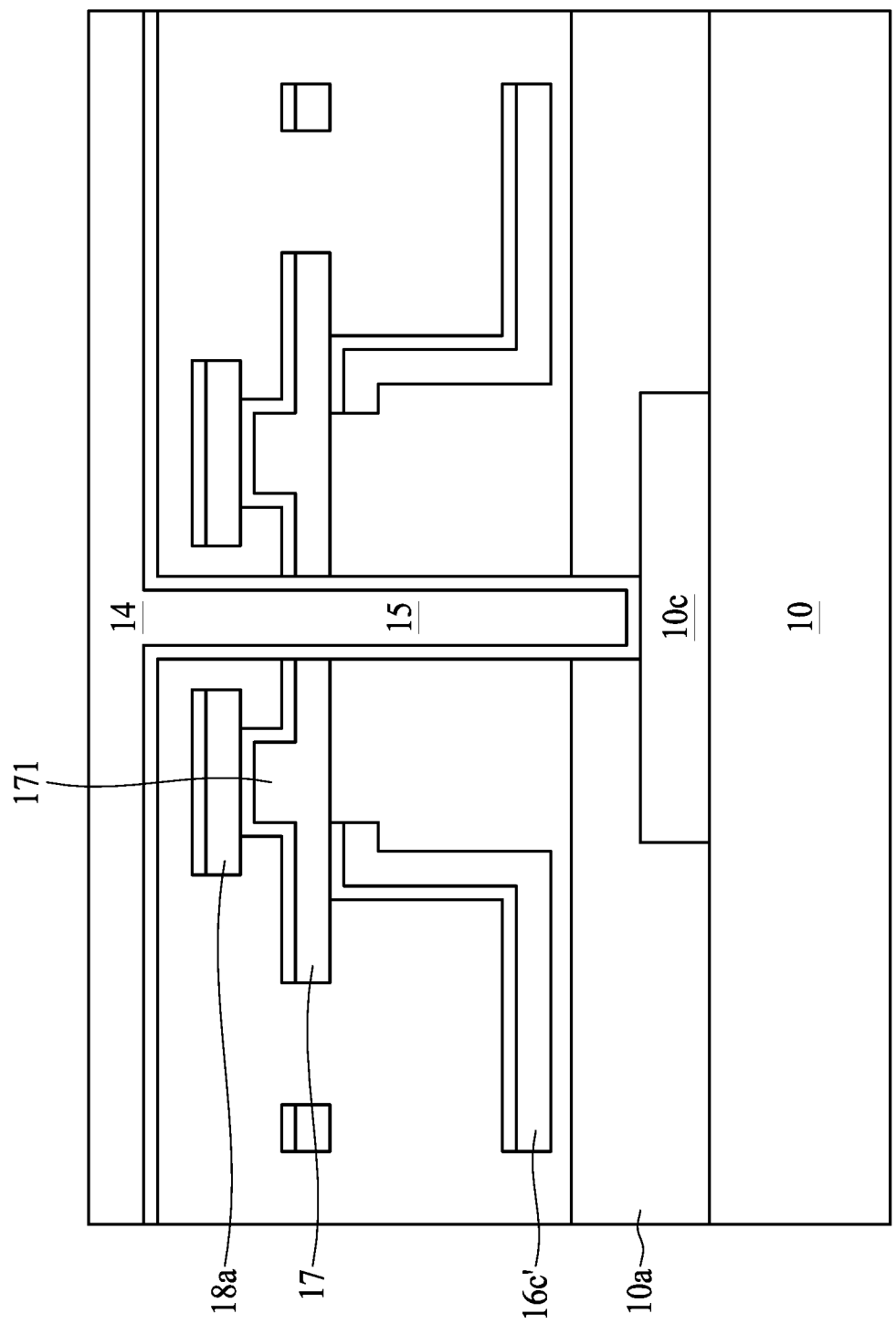

Referring to FIG. 6D, a conductive pad 14 and a conductive via 15 are formed in a series of processes similar to those illustrated in FIGS. 4R to 4U.

Figure 6E:
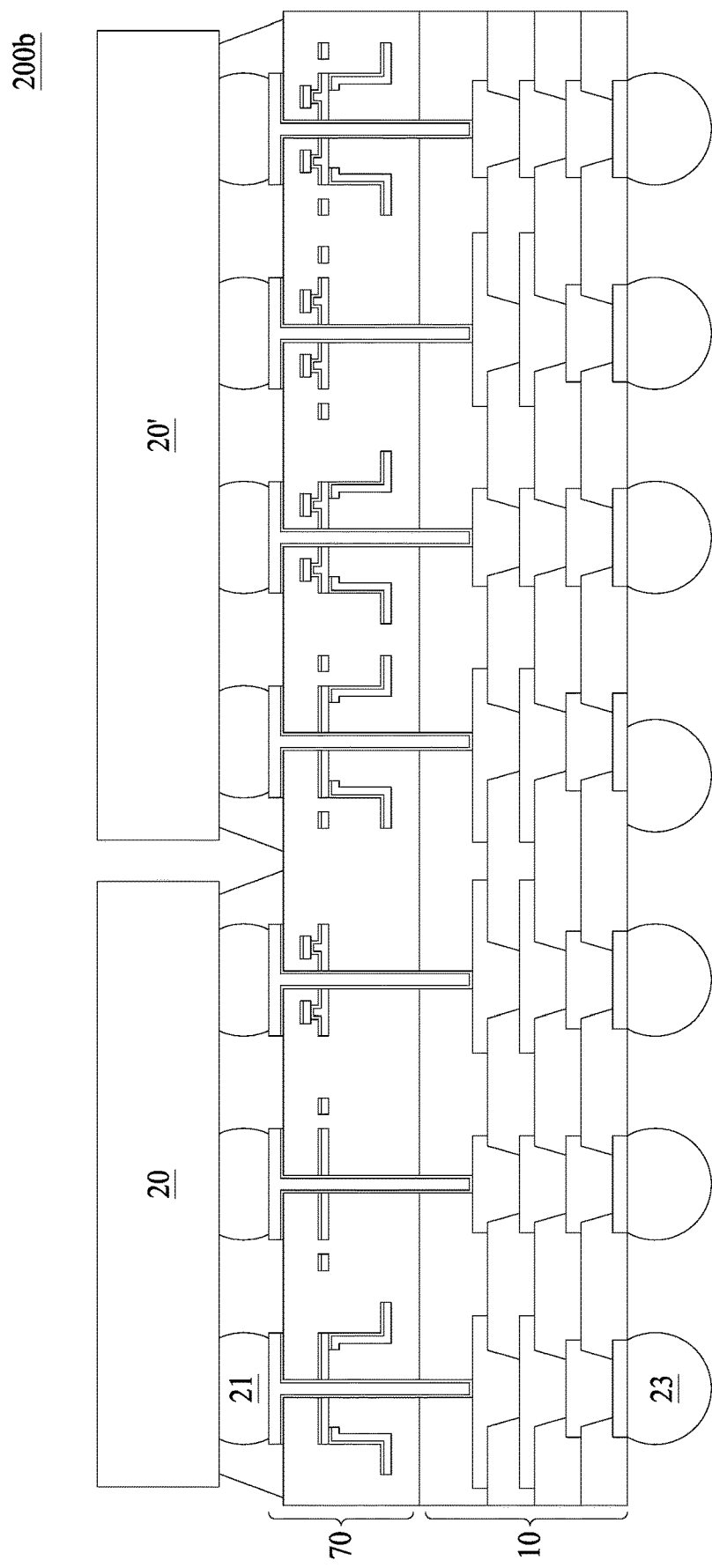
FIG. 6E illustrates a semiconductor device package manufactured in the method illustrated in FIG. 6A-6D.

FIG. 6E illustrates a semiconductor package assembly 200b manufactured in the method illustrated in FIGS. 6A to 6D. The semiconductor package assembly 200b includes a redistribution structure 70 and a substrate 10 including variations of the semiconductor device package 100C of FIG. 3A.

FIG. 7A through FIG. 7D illustrate various stages of a method for manufacturing a semiconductor device package 100D of FIG. 3B.

Figure 7A:
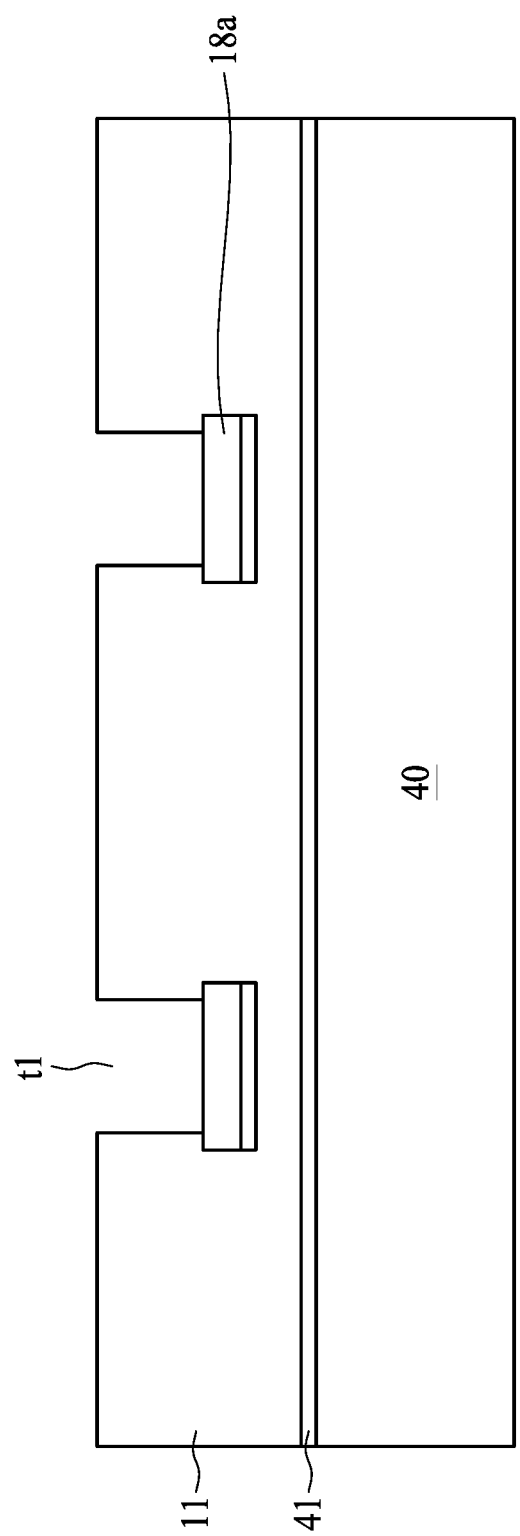
FIG. 7A, FIG. 7B, FIG. 7C, and FIG. 7D illustrate various stages of a method for manufacturing a semiconductor device package of FIG. 3B.

Referring to FIG. 7A, a carrier 40 is provided. A seed layer 41 is formed on the carrier 40. A dielectric layer is formed on the seed layer 41. A conductive layer 18a is formed on the dielectric layer. Another dielectric layer is formed on the conductive layer 18a and is patterned to form a trench t2, exposing a portion of the conductive layer 18a. The two dielectric layers are collectively referred as a dielectric layer 11.

Figure 7B:
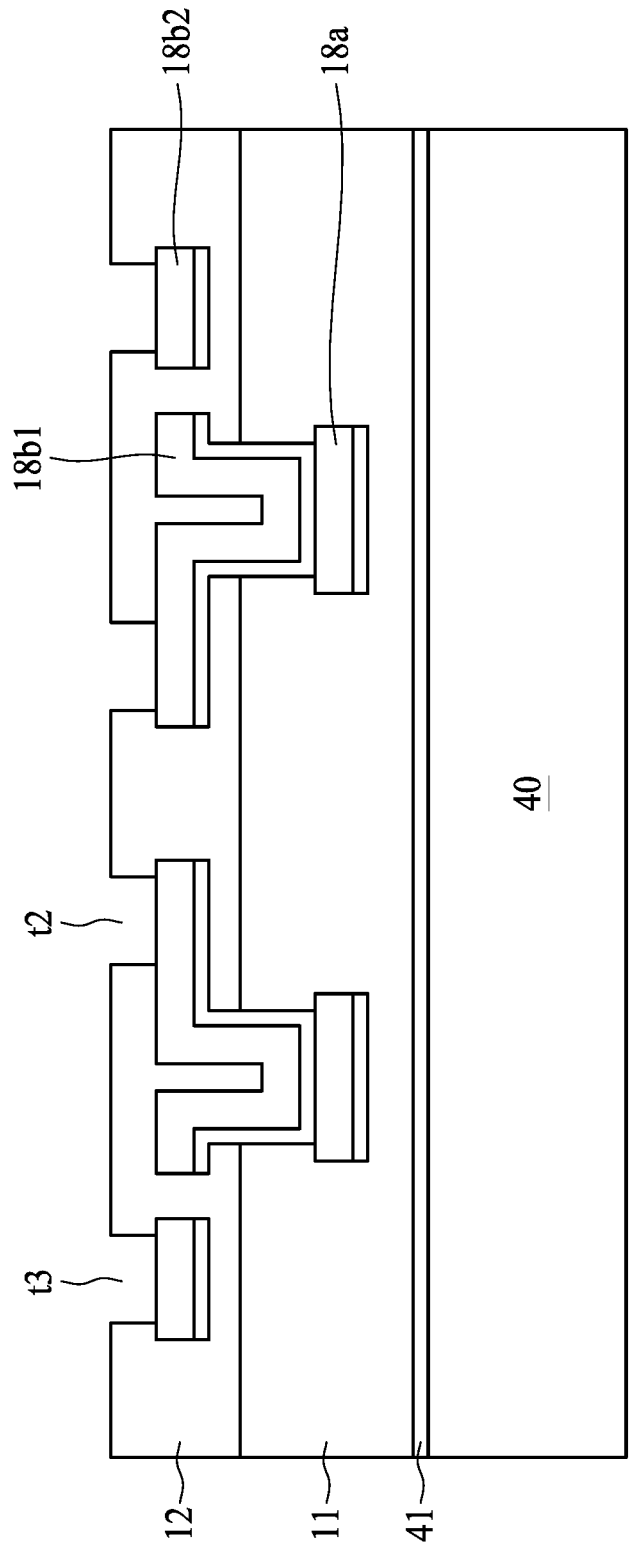

Referring to FIG. 7B, a dielectric layer 12 is formed on the dielectric layer 11. Conductive layers 18b1 and 18b2 are formed in the dielectric layer 12. The conductive layer 18b1 is formed in the trench t1. The conductive layer 18b1 directly contacts the conductive layer 18a. The dielectric layer 12 is patterned to form a trench t2 to expose the conductive layer 18b1. The dielectric layer 12 is patterned to form a trench t3 to expose the conductive layer 18b2.

Figure 7C:
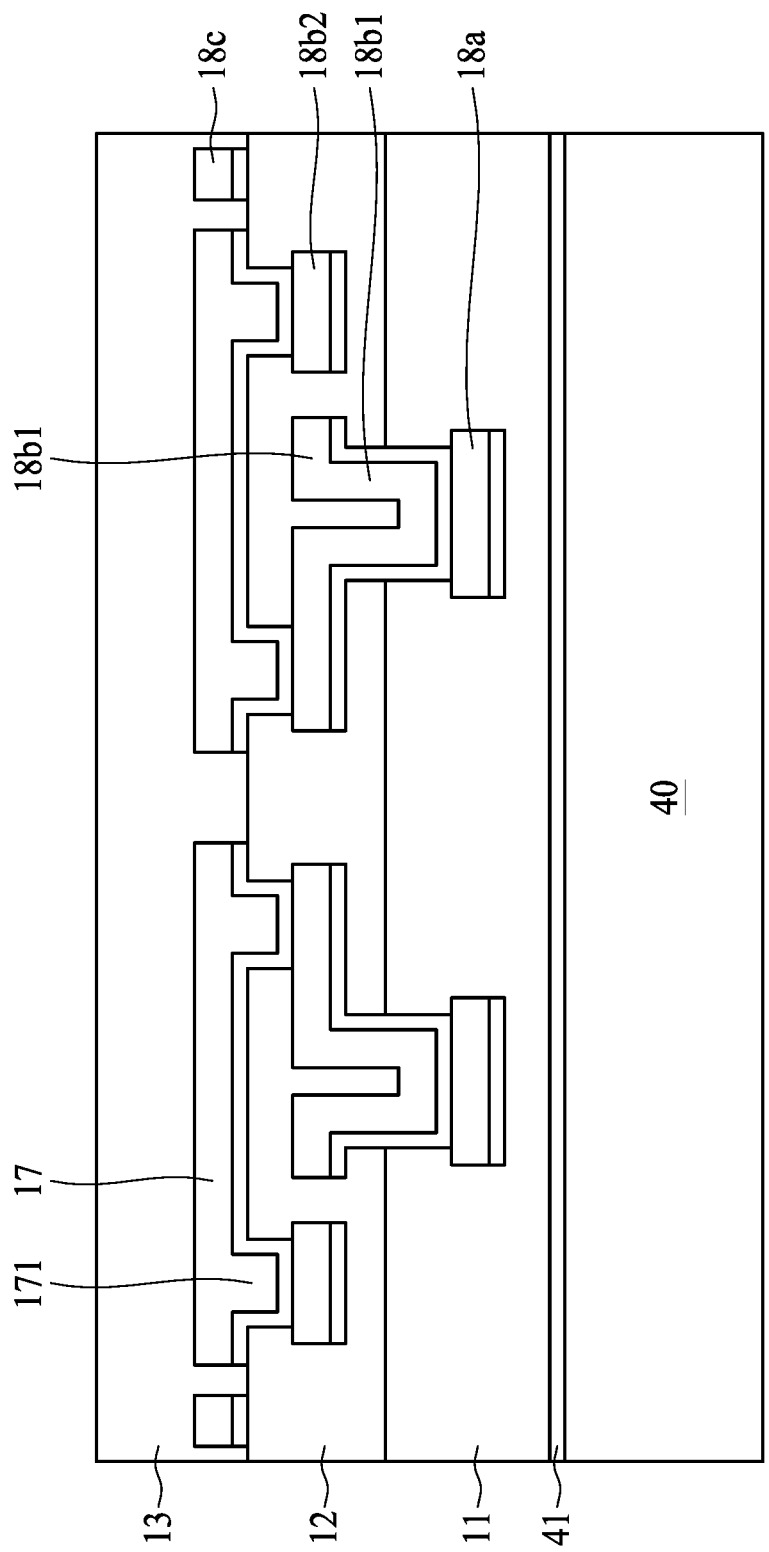

Referring to FIG. 7C, a conductive element 17 is formed on the dielectric layer 12. The conductive element 17 includes a protrusion 171 in the trench t2 to contact the conductive layer 18b1. The conductive element 17 includes a protrusion 172 in the trench t3 to contact the conductive layer 18b2. Next, the dielectric layer 13 is formed on the conductive element 17 and the dielectric layer 12.

Figure 7D:
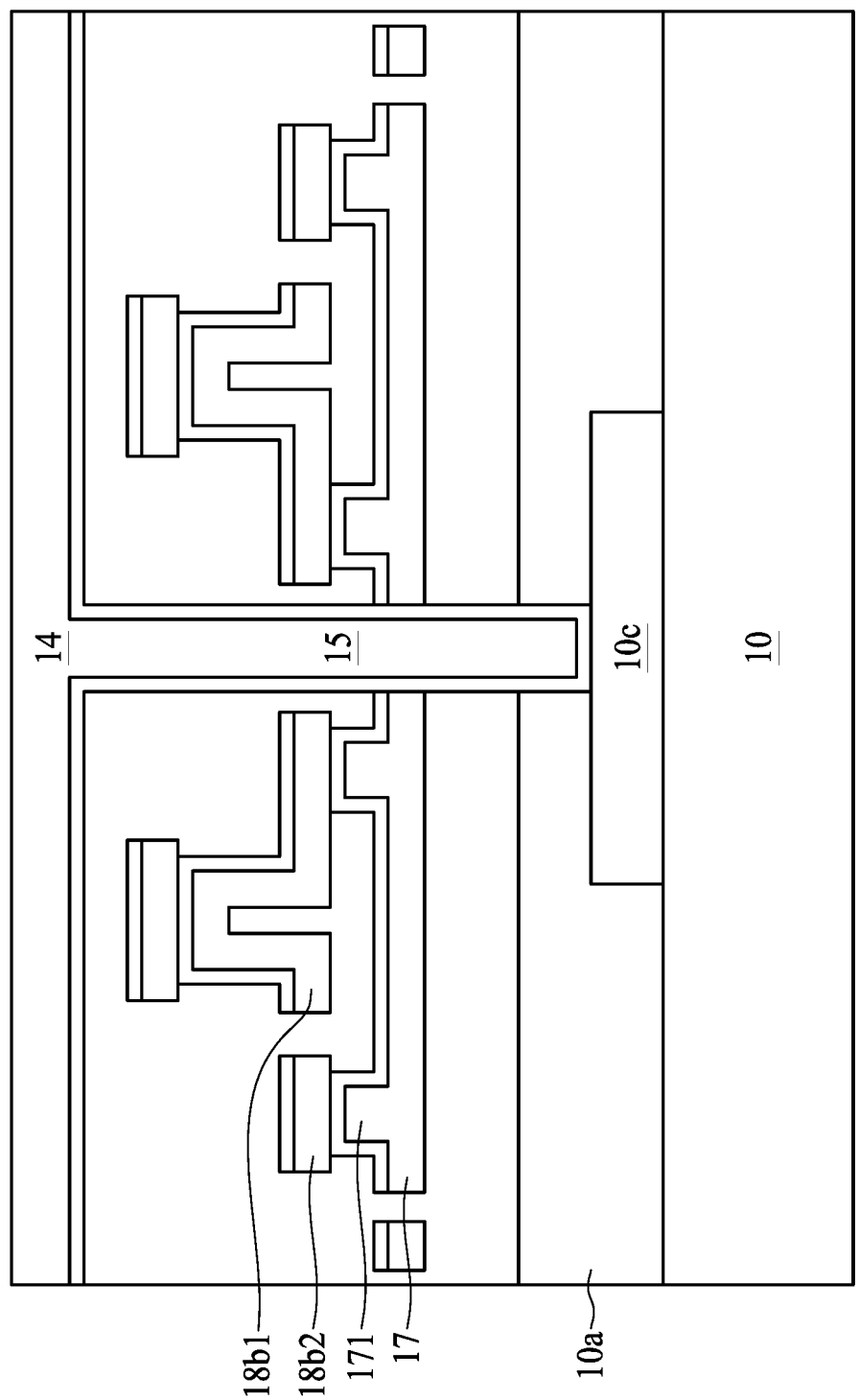

Referring to FIG. 7D, a conductive pad 14 and a conductive via 15 are formed in a series of processes similar to those illustrated in FIGS. 4R to 4U.

Figure 7E:
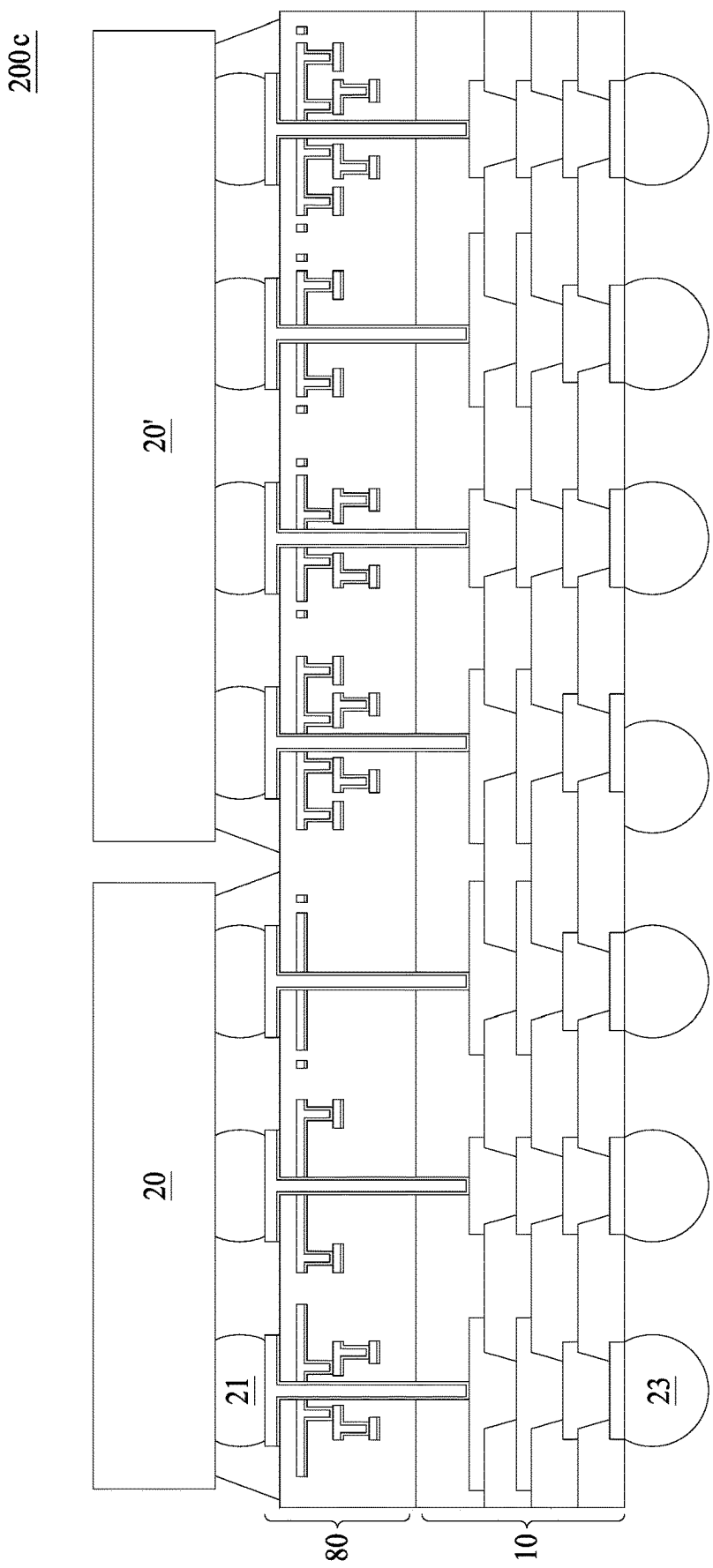
FIG. 7E illustrates a semiconductor device package manufactured in the method illustrated in FIG. 7A-7D.

FIG. 7E illustrates a semiconductor package assembly 200c manufactured in the method illustrated in FIGS. 7A to 7D. The semiconductor device package 200c of FIG. 7E includes a redistribution structure 80 and a substrate 10 including variations of the semiconductor device package 100D of FIG. 3B.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±11%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between the highest point and the lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a substrate;
   a redistribution structure disposed over the substrate and including a first dielectric layer and a first conductive layer;
   a conductive pad disposed on a first surface of the first dielectric layer;
   a conductive element disposed in the first dielectric layer and electrically connected to the conductive pad; and
   a conductive via extending from the conductive pad toward the substrate through the conductive element and the first dielectric layer,
   wherein the first conductive layer is separated from the conductive via,
   wherein the redistribution structure further comprises:
   a second dielectric layer disposed between the first dielectric layer and the substrate; and
   a second conductive layer disposed in the first dielectric layer and the second dielectric layer, and electrically connected to the conductive element;
   wherein the conductive via extends through the second dielectric layer and,
   wherein the second conductive layer is separated from the conductive via.

2. The semiconductor device package of claim 1, wherein the first conductive layer directly contacts the conductive element.

3. The semiconductor device package of claim 1, wherein the conductive pad is separated from the conductive element.

4. The semiconductor device package of claim 1, wherein the first conductive layer comprises:
   a first portion substantially disposed on a second surface of the first dielectric layer;
   a third portion, disposed at a higher elevation than the first portion with respect to the substrate,
   wherein the first portion and the third portion extends in a direction different from that of the conductive via.

5. The semiconductor device package of claim 4, wherein the first conductive layer further comprises:
   a second portion extending in a direction substantially parallel to that of the conductive via, wherein the second portion connects the first portion and the third portion.

6. The semiconductor device package of claim 5, wherein the first conductive layer further includes a seed layer substantially conformal with first portion, second portion and third portion.

7. The semiconductor device package of claim 1, wherein the conductive via is electrically connected with the first conductive layer through the conductive element.

8. The semiconductor device package of claim 1, wherein the conductive element encloses a top portion of the conductive via.

9. The semiconductor device package of claim 1, further comprising a first seed layer disposed on the first surface of the first dielectric layer and a second surface of the conductive element; and a second seed layer having a smooth contour of a lateral surface of the conductive via.

10. The semiconductor device package of claim 1, wherein the conductive via has a lateral surface traversing through a single material along a thickness of the redistribution structure.

11. The semiconductor device package of claim 1, wherein the first conductive element has a ring or ring-like structure.

12. The semiconductor device package of claim 1, further comprising:
- a third dielectric layer disposed on the second dielectric layer and the substrate;
- a third conductive layer disposed in the first dielectric layer, the second dielectric layer,
- and the third dielectric layer, and electrically connected to the conductive element;
- wherein the conductive via extends through the third dielectric layer and,
- wherein the third conductive layer is separated from the conductive via.

13. A semiconductor device package, comprising:
- a substrate;
- a first dielectric layer having a top surface, a bottom surface, and a lateral surface disposed over the substrate;
- a conductive element disposed in the first dielectric layer;
- a first conductive layer disposed on the bottom surface and the lateral surface of the first dielectric layer and electrically connected with the conductive element;
- a conductive via disposed on the substrate;
- a second dielectric layer disposed between the first conductive layer and the conductive via;
- a third dielectric layer disposed on the bottom surface of the first dielectric layer and having a bottom surface and a lateral surface;
- a fourth dielectric layer disposed between the second conductive layer and the conductive via; and
- a second conductive layer disposed on the bottom surface and the lateral surface of the third dielectric layer,
- wherein the second dielectric layer encloses the conductive via, and
- wherein the first conductive layer has a portion extending toward the conductive via along a bottom surface of the conductive element,
- wherein the second conductive layer extends through the second dielectric layer and is electrically connected with the conductive element, and
- wherein the fourth dielectric layer encloses the conductive via.

14. The semiconductor device package of claim 13, further comprising a first conductive pad extending along the top surface of the first dielectric layer, wherein the first conductive pad is electrically connected to the conductive via and the conductive element.

15. The semiconductor device package of claim 13, wherein the conductive element has an inner lateral surface in electrical contact with the conductive via and an outer lateral surface in contact with the first dielectric layer.

* * * * *